(12) United States Patent
Kikuchi et al.

(10) Patent No.: US 7,911,244 B2
(45) Date of Patent: Mar. 22, 2011

(54) DIFFERENTIAL DRIVE CIRCUIT AND COMMUNICATION DEVICE

(75) Inventors: Hidekazu Kikuchi, Kanagawa (JP); Gen Ichimura, Tokyo (JP); Miho Ozawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 129 days.

(21) Appl. No.: 12/277,559

(22) Filed: Nov. 25, 2008

(65) Prior Publication Data
US 2009/0140778 A1 Jun. 4, 2009

(30) Foreign Application Priority Data

Nov. 30, 2007 (JP) ................... 2007-311134
Sep. 9, 2008 (JP) ................... 2008-231338

(51) Int. Cl.
*H03B 1/00* (2006.01)
*H03K 3/00* (2006.01)

(52) U.S. Cl. ........ 327/108; 327/109; 327/110; 327/111; 327/112; 327/562; 327/563

(58) Field of Classification Search .................. 327/108, 327/562, 563
See application file for complete search history.

(56) References Cited

U.S. PATENT DOCUMENTS
2008/0174462 A1* 7/2008 Tsuchi .......................... 341/144

FOREIGN PATENT DOCUMENTS
| JP | 2003-347860 | 12/2003 |
| JP | 2006-340266 | 12/2006 |
| JP | 2006-345259 | 12/2006 |
| JP | 2007-312395 | 11/2007 |

* cited by examiner

*Primary Examiner* — Lincoln Donovan
*Assistant Examiner* — John W Poos
(74) *Attorney, Agent, or Firm* — Oblon, Spivak, McClelland, Maier & Neustadt, L.L.P.

(57) ABSTRACT

A differential drive circuit includes at least a first or second drive system. The first drive system has first and second field effect transistors, first and second resistors, and first and second circuits controlling the source voltages of the first and second field effect transistors to equal first and second drive target voltages, the first and second field effect transistors having sources connected to a power potential via the first and second resistors, respectively. The second drive system has third and fourth field effect transistors, third and fourth resistors, and third and fourth circuits controlling the source voltages of the third and fourth field effect transistors to equal third and fourth drive target voltages, the third and fourth field effect transistors having sources connected to a reference potential via the third and fourth resistors, respectively. A common-mode voltage is driven to form a constant differential signal across a load resistance.

20 Claims, 23 Drawing Sheets

DIFFERENTIAL DRIVE CIRCUIT AND COMMUNICATION DEVICE

CROSS REFERENCES TO RELATED APPLICATIONS

The present invention contains subject matter related to Japanese Patent Applications JP 2007-311134 and JP 2008-231338 respectively filed in the Japanese Patent Office on Nov. 30, 2007 and Sep. 9, 2008, the entire contents of which are incorporated herein by reference.

BACKGROUND OF THE INVENTION

1. Field of the Invention

The present invention relates to a differential drive circuit and a communication device which process a differential signal propagated on a differential transmission line or the like.

2. Description of the Related Art

Differential signals are widely used for long-distance transmission of data at high speed.

In particular, the push-pull driver described in Japanese Unexamined Patent Application Publication No. 2006-345259 is frequently used because the current necessary for driving a differential signal to the load is small.

In this type of circuit, the average voltage across the load does not stabilize unless the average values of a pull-up current and a pull-down current over a long period of time match each other. Thus, the current source is adjusted by using such feedback control that makes the common-mode voltage output constant.

Also, Japanese Unexamined Patent Application Publication No. 2003-347860 discloses a technique for suppressing generation of a common-mode voltage by adjusting the driving timings of drive transistors.

SUMMARY OF THE INVENTION

However, the technique of adjusting the current source by using such feedback control that makes a common-mode voltage output constant is a slow-response control and only serves to keep the average voltage constant. The instantaneous value of a common-mode voltage fluctuates greatly due to variations in ON/OFF timing of a push-pull transistor.

Such fluctuation in common-mode voltage produces a pulsating electric current that is propagated on the differential transmission line and returns by passing through a line connecting between the ground potentials GND of the transmitter and the receiver, scattering large radiation noise.

As described above, the technique disclosed in Japanese Unexamined Patent Application Publication No. 2003-347860 suppresses generation of a common-mode voltage by adjusting the drive timings of drive transistors.

However, strictly speaking, this method is effective only when the rise time of a pull-up drive circuit and the fall time of a pull-down circuit are equal. In actuality, there is a difference between the rise and fall times, and hence it is difficult to suppress the common-mode voltage fluctuation to zero.

A more commonly employed method is to suppress common-mode voltage fluctuation by using a filter element called a common-mode filter or a pulse transformer for the output of a differential drive circuit that contain fluctuations in common-mode voltage.

However, disadvantageously, such a filter element is large in size, making it difficult to integrate the filter element onto a semiconductor substrate together with the drive circuit. Also, the filter element increases the number of parts and is inexpensive.

It is desirable to provide a differential drive circuit and a communication device which can output a differential signal with desired common-mode component even when the gate voltage-drain current characteristic of transistors is non-linear, or even when the characteristic differs between transistors of different polarities.

According to an embodiment of the present invention, there is provided a differential drive circuit including at least one of a first drive system and a second drive system. The first drive system includes a first field effect transistor of a first conductivity type, a second field effect transistor of the first conductivity type, a first resistor and a second resistor, a first circuit that controls a source voltage of the first field effect transistor so as to be equal to a first drive target voltage that is supplied, and a second circuit that controls a source voltage of the second field effect transistor so as to be equal to a second drive target voltage that is supplied, the first field effect transistor having a source connected to a power supply potential source via the first resistor, and a drain connected to a first output node, the second field effect transistor having a source connected to the power supply potential source via the second resistor, and a drain connected to a second output node. The second drive system includes a third field effect transistor of a second conductivity type, a fourth field effect transistor of the second conductivity type, a third resistor and a fourth resistor, a third circuit that controls a source voltage of the third field effect transistor so as to be equal to a third drive target voltage that is supplied, and a fourth circuit that controls a source voltage of the fourth field effect transistor so as to be equal to a fourth drive target voltage that is supplied, the third field effect transistor having a source connected to a reference potential source via the third resistor, and a drain connected to the first output node, the fourth field effect transistor having a source connected to the reference potential source via the fourth resistor, and a drain connected to the second output node. The differential drive circuit drives a common-mode voltage so as to form a constant differential signal across a load resistance.

Preferably, the first drive target voltage and the second drive target voltage form a differential signal pair whose sum is constant, and in the second drive system, and the third drive target voltage and the fourth drive target voltage form a differential signal pair whose sum is constant.

Preferably, the first drive target voltage and the third drive target voltage are signals of the same waveform with an offset, and the second drive target voltage and the fourth drive target voltage are signals of the same waveform with an offset.

Preferably, an average voltage of the first drive target voltage and the second drive target voltage is biased so as to be lower than the power supply potential by a constant value, and an average voltage of the third drive target voltage and the fourth drive target voltage is biased so as to be higher than the reference potential by a constant value.

Preferably, the first circuit includes a first operational amplifier, the first operational amplifier having a first input terminal connected to a supply line of the first drive target voltage, a second input terminal connected to the source of the first field effect transistor, and an output connected to a gate of the first field effect transistor, the second circuit includes a second operational amplifier, the second operational amplifier having a third input terminal connected to a supply line of the second drive target voltage, a fourth input terminal connected to the source of the second field effect transistor, and an output connected to a gate of the second field effect transistor, the third circuit includes a third operational amplifier, the third operational amplifier having a fifth input terminal connected to a supply line of the third drive target voltage, a sixth input terminal connected to the source of the third field effect transistor, and an output connected to a gate of the third field effect transistor, and the fourth circuit includes a fourth operational amplifier, the fourth operational amplifier having a seventh input terminal connected to a supply line of the fourth drive target voltage, an eighth input terminal connected to the source of the fourth field effect transistor, and an output connected to a gate of the fourth field effect transistor.

Preferably, the first drive system further includes a fifth resistor connected between the source of the first field effect transistor and the source of the second field effect transistor, and the second drive system further includes a sixth resistor connected between the source of the third field effect transistor and the source of the fourth field effect transistor.

Preferably, the first drive system further includes a first differential amplifier that receives a differential voltage and generates the first drive target voltage and the second drive target voltage, supplies the generated first drive target voltage to the first circuit, and supplies the generated second drive target voltage to the second circuit, and the second drive system further includes a second differential amplifier that receives the differential voltage and generates the third drive target voltage and the fourth drive target voltage, supplies the generated third drive target voltage to the third circuit, and supplies the generated fourth drive target voltage to the fourth circuit.

Preferably, the first drive system further includes a digital-to-analog converter (DAC) that generates the first drive target potential and the second drive target potential in accordance with inputted digital data, and the second drive system further includes a digital-to-analog converter (DAC) that generates the third drive target potential and the fourth drive target potential in accordance with inputted digital data.

Preferably, the first drive system further includes a first DAC that generates the first drive target potential from a first addition/subtraction result of two numerical inputs, and a second DAC that generates the second drive target potential from a second addition/subtraction result of two numerical inputs, and the second drive system further includes a third DAC that generates the third drive target potential from a third addition/subtraction result of two numerical inputs, and a fourth DAC that generates the fourth drive target potential from a fourth addition/subtraction result of two numerical inputs.

Preferably, the first drive system further includes a stabilizing circuit that stabilizes outputs of the first DAC and the second DAC, and the second drive system further includes a stabilizing circuit that stabilizes outputs of the third DAC and the fourth DAC.

Preferably, the first drive system further includes a multiplier that multiplies a specific input by a coefficient specified so as to make an output of the DAC with respect to the input become a constant value, and inputs the multiplied input to the DAC, and the second drive system further includes a multiplier that multiplies a specific input by a coefficient specified so as to make an output of the DAC with respect to the input become a constant value, and inputs the multiplied input to the DAC.

Preferably, the first drive system further includes an offset adding circuit that adds an offset to each of the first drive target potential and the second drive target potential that are generated by the first differential amplifier, and the second drive system further includes an offset adding circuit that adds an offset to each of the third drive target potential and the fourth drive target potential that are generated by the second differential amplifier.

Preferably, the first drive system further includes a first resistance-adjusting field effect transistor that is connected in parallel with a load resistance of the first differential amplifier, and an adjusting circuit that adjusts a gate potential of the first resistance-adjusting field effect transistor, and the second drive system further includes a second resistance-adjusting field effect transistor that is connected in parallel with a load resistance of the second differential amplifier, and an adjusting circuit that adjusts a gate potential of the second resistance-adjusting field effect transistor.

Preferably, the differential drive circuit is connected with a common-mode feedback circuit that suppresses variation in common-mode voltage on the load side.

According to an embodiment of the present invention, there is provided a communication device including a transmitter arranged on either end side of a differential transmission line. The transmitter includes a differential drive circuit that drives a common-mode voltage so as to form a constant differential signal across a load resistance. The differential drive circuit includes a first field effect transistor of a first conductivity type, a second field effect transistor of the first conductivity type, a third field effect transistor of a second conductivity type, a fourth field effect transistor of the second conductivity type, a first output node and a second output node, a first resistor, a second resistor, a third resistor, and a fourth resistor, the first field effect transistor having a source connected to a power supply potential via the first resistor, and a drain connected to the first output node, the second field effect transistor having a source connected to the power supply potential via the second resistor, and a drain connected to the second output node, the third field effect transistor having a source connected to a reference potential via the third resistor, and a drain connected to the first output node, the fourth field effect transistor having a source connected to the reference potential via the fourth resistor, and a drain connected to the second output node, a first circuit that controls a source voltage of the first field effect transistor so as to be equal to a first drive target voltage that is supplied, a second circuit that controls a source voltage of the second field effect transistor so as to be equal to a second drive target voltage that is supplied, a third circuit that controls a source voltage of the third field effect transistor so as to be equal to a third drive target voltage that is supplied, and a fourth circuit that controls a source voltage of the fourth field effect transistor so as to be equal to a fourth drive target voltage that is supplied.

Preferably, the communication device further includes a receiver arranged in parallel with the transmitter with respect to the differential transmission line.

According to an embodiment of the present invention, the first and second resistors are respectively connected between the sources of the first and second field effect transistors and the power source potential, and the third and fourth resistors are respectively connected between the sources of the third and fourth field effect transistors and the reference potential.

Then, feedback control is applied such that the source voltages of the first and second field effect transistors and the source voltages of the third and fourth field effect transistors become equal to their respective drive target voltages, and gates of the first and second field effect transistors and the gates of the third and fourth field effect transistors are driven to extract outputs from the drains.

This differential drive circuit functions as a so-called differential push-pull driver.

According to an embodiment of the present invention, a differential signal with desired common-mode component can be outputted by simple configuration, even when the gate voltage-drain current characteristic of transistors is non-linear, or even when the characteristic differs between transistors of different polarities.

DESCRIPTION OF THE PREFERRED EMBODIMENTS

Hereinbelow, embodiments of the present invention will be described with reference to the drawings.

First Embodiment

Figure 1:
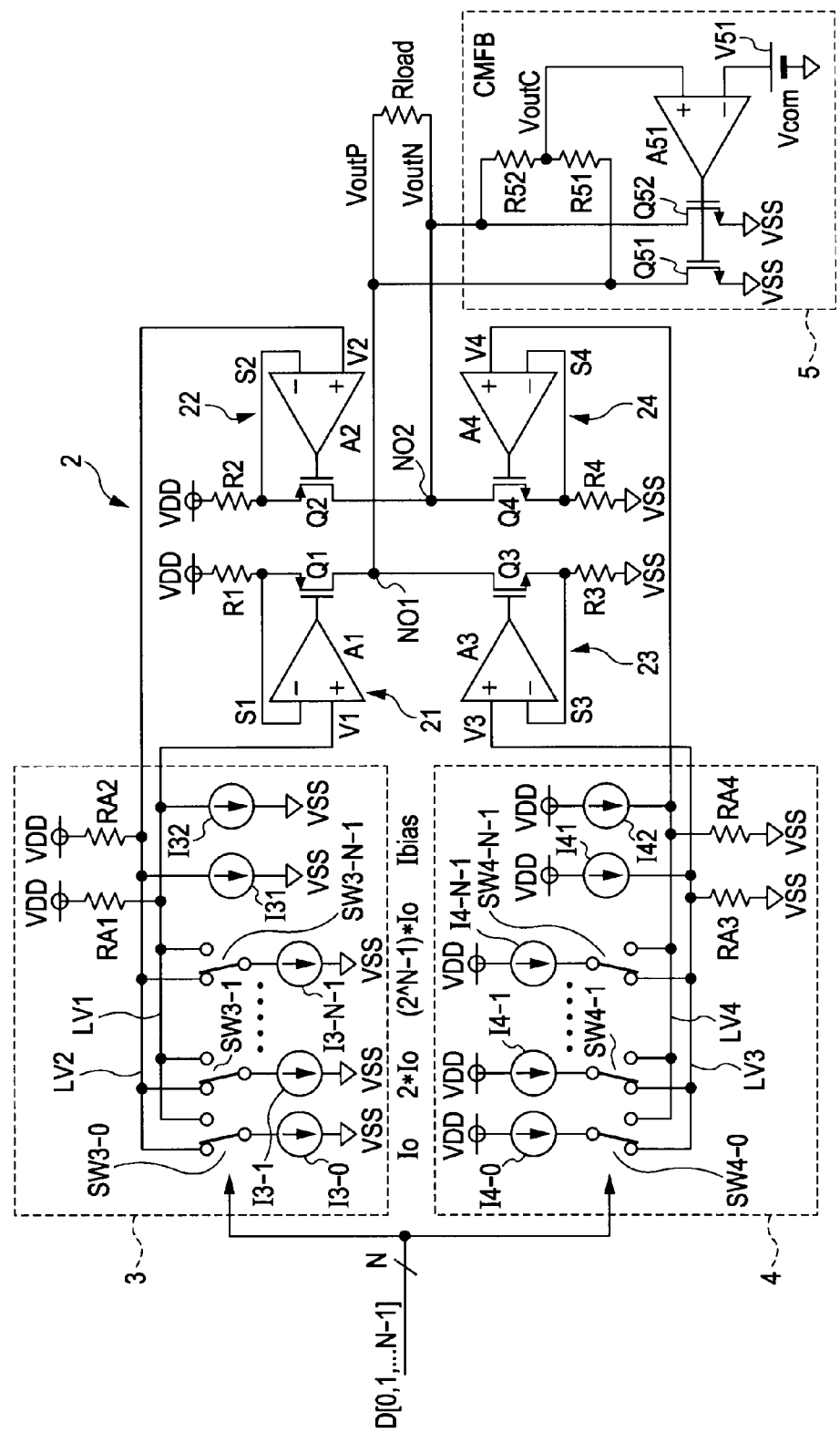
FIG. 1 is a circuit diagram showing a configuration of a driver including a differential drive circuit according to a first embodiment of the present invention.

FIG. 1 is a circuit diagram showing a configuration of a driver including a differential drive circuit according to a first embodiment of the present invention.

A driver 1 according to this embodiment has a differential drive circuit 2, a first digital-to-analog converter (DAC) 3, a second DAC 4, and a common-mode feedback (CMFB) circuit 5.

The differential drive circuit 2 has a PMOS transistor Q1 that is a first field effect transistor of a first conductivity type, for example, a p-channel type (P-type), and a PMOS transistor Q2 that is a P-type second field effect transistor.

The differential drive circuit 2 has an NMOS transistor Q3 that is a third field effect transistor of a second conductivity type, for example, an n-channel type (N-type), and an NMOS transistor Q4 that is an N-type fourth field effect transistor.

The source of the first transistor Q1 is connected to a power supply potential source VDD via a first resistor R1, and the drain is connected to a first output node NO1.

The source of the second transistor Q2 is connected to the power supply potential source VDD via a second resistor R2, and the drain is connected to a second output node NO2.

The source of the third transistor Q3 is connected to a reference potential source VSS via a third resistor R3, and the drain is connected to the first output node NO1.

The source of the fourth transistor Q4 is connected to the reference potential source VSS via a fourth resistor R4, and the drain is connected to the second output node NO2.

The reference potential VSS includes a ground potential GND.

Further, the differential drive circuit 2 according to this embodiment has a first circuit 21 that controls a source voltage S1 of the first transistor Q1 so as to be equal to a first drive target voltage V1 supplied from the DAC 3.

The differential drive circuit 2 has a second circuit 22 that controls a source voltage S2 of the second transistor Q2 so as to be equal to a second drive target voltage V2 supplied from the DAC 3.

The differential drive circuit 2 has a third circuit 23 that controls a source voltage S3 of the third transistor Q3 so as to be equal to a third drive target voltage V3 supplied from the DAC 4.

The differential drive circuit 2 has a fourth circuit 24 that controls a source voltage S4 of the fourth transistor Q4 so as to be equal to a fourth drive target voltage V4 that is supplied.

The differential drive circuit 2 drives, for example, a transmission line on the output side so that a common-mode voltage forms a constant differential signal across a load resistance Rload.

The first circuit 21 is configured by a first operational amplifier A1.

In the first circuit 21, a non-inverting input terminal (+) as a first input terminal is connected to the supply line of the first drive target voltage V1, an inverting input terminal (−) as a second input terminal is connected to the source of the first transistor Q1, and the output is connected to the gate of the first transistor Q1.

The second circuit 22 is configured by a second operational amplifier A2.

In the second circuit 22, a non-inverting input terminal (+) as a third input terminal is connected to the supply line of the second drive target voltage V2, an inverting input terminal (−) as a fourth input terminal is connected to the source of the second transistor Q2, and the output is connected to the gate of the second transistor Q2.

The third circuit 23 is configured by a third operational amplifier A3.

In the third circuit 23, a non-inverting input terminal (+) as a fifth input terminal is connected to the supply line of the third drive target voltage V3, an inverting input terminal (−) as a sixth input terminal is connected to the source of the third transistor Q3, and the output is connected to the gate of the third transistor Q3.

The fourth circuit 24 is configured by a fourth operational amplifier A4.

In the fourth circuit 24, a non-inverting input terminal (+) as a seventh input terminal is connected to the supply line of the fourth drive target voltage V4, an inverting input terminal (−) as an eighth input terminal is connected to the source of the fourth transistor Q4, and the output is connected to the gate of the fourth transistor Q4.

The DAC 3 receives an N-bit digital signal D to generate the first drive target voltage V1 and the second drive target voltage V2, supplies the generated first drive target voltage V1 to the first circuit 21 of the differential drive circuit 2, and supplies the second drive target voltage V2 to the second circuit 22.

The DAC 4 receives the N-bit digital signal D to generate the third drive target voltage V3 and the fourth drive target voltage V4, supplies the generated third drive target voltage V3 to the third circuit 23 of the differential drive circuit 4, and supplies the fourth drive target voltage V4 to the fourth circuit 24.

The DAC 3 has a resistor RA1 connected between a first supply line LV1 of the first drive target voltage V1 and the power supply potential source VDD, and a current source I31 connected between the first supply line LV1 and the reference potential source VSS.

The DAC 3 has a resistor RA2 connected between a second supply line LV2 of the second drive target voltage V2 and the power supply potential source VDD, and a current source I32 connected between the second supply line LV2 and the reference potential source VSS.

The DAC 3 has N power supplies I3-0 to I3-N-1 each connected to the reference potential source VSS and whose current values are weighted.

Further, the DAC 3 has switches SW3-0 to SW3-N-1 that selectively connect the individual current sources I3-0 to I3-N-1 and the first or second supply line LV1, LV2.

The reference potential VSS includes the ground potential GND.

The DAC 4 has a resistor RA3 connected between a third supply line LV3 of the third drive target voltage V3 and the reference potential source VSS, and a current source I41 connected between the third supply line LV3 and the power potential source VDD.

The DAC 4 has a resistor RA4 connected between a fourth supply line LV4 of the fourth drive target voltage V4 and the reference potential source VSS, and a current source I42 connected between the fourth supply line LV4 and the power potential source VDD.

The DAC 4 has N power supplies I4-0 to I4-N-1 each connected to the power supply potential VDD and whose current values are weighted.

Further, the DAC 4 has switches SW4-0 to SW4-N-1 that selectively connect the individual current sources I4-0 to I4-N-1 and the third or fourth supply line LV3, LV4.

The reference potential VSS includes the ground potential GND.

The common-mode feedback (CMFB) circuit 5 has a functional of absorbing excess current supplied to the load side.

The common-mode feedback (CMFB) circuit 5 has N-type field effect transistors Q51 and Q52, an operational amplifier A51, resistors R51 and R52, and a common voltage source V51.

The drain of the transistor Q51 is connected to the first output node NO1 side of the differential drive circuit 2, the source is connected to the reference potential VSS (for example, the ground potential GND), and the gate is connected to the output of the operational amplifier A51.

The drain of the transistor Q52 is connected to the second output node NO2 side of the differential drive circuit 2, the source is connected to the reference potential VSS (for example, the ground potential GND), and the gate is connected to the output of the operational amplifier A51.

The resistors R51 and R52 are connected in series between the first output node NO1 and the second output node NO2 of the differential drive circuit 2. The junction of the two resistors is connected to the non-inverting input terminal (+) of the operational amplifier A51. The common voltage source V51 is connected to the inverting input terminal (−) of the operational amplifier A51.

In the driver 1 having the configuration mentioned above, output voltage information given in a digital form is converted as follows in the DAC 3 and the DAC 4.

That is, in the DAC 3, the output voltage information is converted into the first drive target voltage V1 and the second drive target voltage V2, which are analog voltages serving as the drive target values for the first and second transistors (PMOS transistors) Q1 and Q2.

In the DAC 4, the output voltage information is converted into the third drive target voltage V3 and the fourth drive target voltage V4, which are analog voltages serving as the drive target values for the third and fourth transistors (NMOS transistors) Q3 and Q4.

The first drive target voltage V1 and the second drive target voltage V2 are a differential signal pair whose sum is constant, and the third drive target voltage V3 and the fourth drive target voltage V4 are also a differential signal pair whose sum is constant.

The first drive target voltage V1 and the third drive target voltage V3 are signals with an offset but of the same waveform, and the second drive target voltage V2 and the fourth drive target voltage V4 are also signals of the same waveform with an offset.

The first drive target voltage V1 and the second drive target voltage V2 are each biased such that the average voltage becomes lower than the power supply potential VDD by a constant value.

The third drive target voltage V3 and the fourth drive target voltage V4 are each biased such that the average voltage becomes higher than the reference potential VSS by a constant value.

The instantaneous voltages of the first to fourth drive target voltages V1 to V4 are represented by the following equations that contain a single parameter V(t).

[Eq. 1]

$$V1(t)=VbiasP+V(t) \quad (1)$$

$$V2(t)=VbiasP-V(t) \quad (2)$$

$$V3(t)=VbiasN+V(t) \quad (3)$$

$$V4(t)=VbiasN-V(t) \quad (4)$$

An operational amplifier An (n=1 to 4) constitutes negative feedback (NFB) such that a source voltage Sn of a transistor Qn becomes equal to a drive target voltage Vn.

As a result, currents determined by V(t) flow to the resistors R1 to R4, and equal currents flow to the drains of the transistors Q1 to Q4.

Supposing that the resistance values of the resistors R1 to R4 are all R, a current Ipos that flows from the drain junction of the transistor Q1 and the transistor Q3 toward a load is represented by the following equation.

[Eq. 2]

$$Ipos = (VDD - VbiasP - V(t))/R - (VbiasN + V(t))/R \quad (5)$$
$$= (VDD - VbiasP - VbiasN - 2V(t))/R$$

Likewise, a current Ineg that flows to the drain junction of the transistor Q2 and the transistor Q4 from a load is represented by the following equation.

[Eq. 3]

$$Ineg = (VbiasN - V(t))/R - (VDD - VbiasP + V(t))/R \quad (6)$$
$$= (VbiasN + VbiasP - VDD - 2V(t))/R$$

The current Ipos and the current Ineg become equal to each other by setting the bias in the manner represented by the following equations.

[Eq. 4]

$$VDD-VbiasP=VbiasN \quad (7)$$

[Eq. 5]

$$Ipos=Ineg=-2V(t)/R \quad (8)$$

This means that this circuit neither charges nor discharges an average voltage with respect to a load, and keeps the common-mode voltage constant.

In actual circuit, due to such factors as variation in device performance, it may be difficult for the bias to perfectly satisfy the relationship represented by Equation (7) mentioned above.

This problem can be overcome by setting the bias in such a way that the current Ipos becomes slightly but surely larger than the current Ineg, so that excess current supplied with the current Ipos is absorbed by the common-mode feedback (CMFB) circuit 5.

The CMFB may be narrowband irrespective of the signal V(t). The load drive based on the AC component V(t) of the signal is balanced as indicated by Equation (5) and Equation (6) mentioned above, and has no common-mode component.

Second Embodiment

Figure 2:
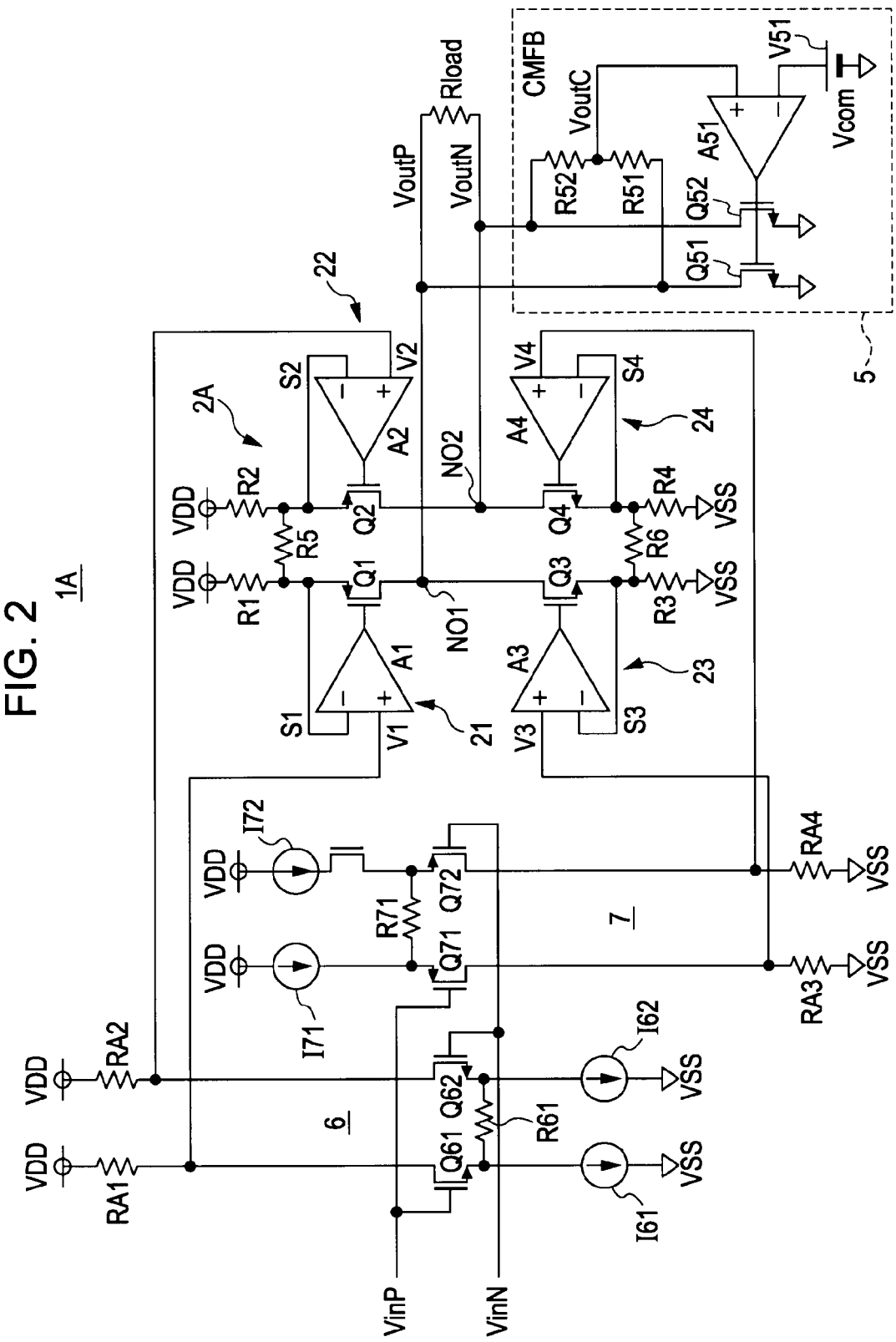
FIG. 2 is a circuit diagram showing a configuration of a driver including a differential drive circuit according to a second embodiment of the present invention.

FIG. 2 is a circuit diagram showing a configuration of a driver including a differential drive circuit according to a second embodiment of the present invention.

A driver 1A shown in FIG. 2 has the following differences from the driver 1 shown in FIG. 1.

First, in a differential drive circuit 2A, a fifth resistor R5 is connected between the source of the first transistor Q1 and the source of the second transistor Q2, and a sixth resistor R6 is connected between the source of the third transistor Q3 and the source of the fourth transistor Q4.

Second, a first differential amplifier 6 and a second differential amplifier 7 are provided instead of the DAC 3 and the DAC 4.

The first differential amplifier 6 receives an analog differential voltage to generate the first drive target voltage V1 and the second drive target voltage V2, supplies the generated first drive target voltage V1 to the first circuit 21, and supplies the second drive target voltage V2 to the second circuit 22.

The second differential amplifier 7 receives an analog differential voltage to generate the third drive target voltage V3 and the fourth drive target voltage V4, supplies the generated third drive target voltage V3 to the third circuit 23, and supplies the fourth drive target voltage V4 to the fourth circuit 24.

The first differential amplifier 6 has NMOS transistors Q61 and Q62 that are field effect transistors of the second conductivity type, resistors RA1, RA2, and RA61, and current sources I61 and I62.

The source of the NMOS transistor Q61 is connected to the current source I61, the drain is connected to the power supply potential source VDD via the resistor RA1, and the gate is connected to the supply line of an analog differential voltage VinP.

The source of the NMOS transistor Q62 is connected to the current source I62, the drain is connected to the power supply potential source VDD via the resistor RA2, and the gate is connected to the supply line of an analog differential voltage VinN.

The resistor R61 is connected between the source of the NMOS transistor Q61 and the source of the NMOS transistor Q62.

The second differential amplifier 7 has PMOS transistors Q71 and Q72 that are field effect transistors of the first conductivity type, resistors RA3, RA4, and RA71, and current sources I71 and I72.

The source of the PMOS transistor Q71 is connected to the current source I71, the drain is connected to the reference potential source VSS (for example, the ground potential GND) via the resistor RA3, and the gate is connected to the supply line of the analog differential voltage VinP.

The source of the PMOS transistor Q72 is connected to the current source I72, the drain is connected to the reference potential source VSS via the resistor RA4, and the gate is connected to the supply line of the analog differential voltage VinN.

The resistor R71 is connected between the source of the PMOS transistor Q71 and the source of the PMOS transistor Q72.

In this example, the signal to be driven to the output is given by an analog differential voltage VinP−VinN.

This voltage is converted into the first to fourth drive target voltages V1 to V4 by the first and second differential amplifiers 6 and 7.

For the first differential amplifier 6 and the second differential amplifier 7 to keep a good linearity, the peak values of the drain current ratios of the differential pair transistors Q61 and Q62, and Q71 and Q72 may not be set very large.

For example, supposing that the ratio is 3:1, in the case of the differential drive circuit 2 not having the fifth resistor R5 and the sixth resistor R6 as in the first embodiment, the current ratio between the first transistor Q1 and the second transistor Q2 at the instant when the maximum current is supplied to the load is also 3:1. As a result, the ratio between a current consumed by the differential drive circuit (output circuit) and a current that can be extracted as an output is 4:2.

Since the output is a circuit that supplies a large current to the load, the fact that a current that is twice the maximum drive current is constantly consumed by the output circuit can be said to be a waste of electric power.

In the second embodiment, there are provided the fifth resistor R5 that short-circuits the sources of the first transistor Q1 and the second transistor Q2, and the sixth resistor R6 that short-circuits the sources of the third transistor Q3 and the fourth transistor Q4.

Since a potential difference of 2 V(t) is applied to the transistors R5 and R6, the current ratio between the first transistor Q1 and the second transistor Q2, and the current ratio between the third NMOS transistor Q3 and the fourth NMOS transistor Q4 exceed the current ratios of transistors within the differential amplifiers 6 and 7.

As a result, the current that can be supplied to the load increases, so the current consumption by the output circuit for providing the same drive current decreases, thereby improving power efficiency.

A description of how the insertion of the fifth resistor R5 and the sixth resistor R6 improves the power efficiency of the differential drive circuit 2A will be given by way of the following examples.

It is supposed here that the value of each of the first to fourth transistors R1 to R4 is R($\Omega$), and the value of each of the fifth and sixth transistors R5 and R6 is r($\Omega$).

First, a case is considered in which there are no fifth and sixth transistors R5 and R6.

It is assumed that the potentials of the third drive target voltage V3 and the fourth drive target voltage V4, that is, the potentials of the source voltage S3 of the third transistor Q3 and of the source voltage S4 of the fourth transistor Q4 are each given by a waveform having a maximum value of 0.6 (V) and a minimum value of 0.2 (V).

The reason why the minimum value may not be dropped to the ground potential GND is to keep good input/output linearity of the upstream circuit, for example.

At the instant when the source voltage S3 is the maximum voltage 0.2 (V), current that the third transistor Q3 draws in from the drain and passes to the third transistor R3 through the source is 0.2/R(A). Since the source voltage S4 becomes the maximum voltage 0.6 (V) at the same time, current that the fourth NMOS transistor Q4 draws in from the drain and passes to the fourth transistor R4 through the source is 0.6/R (A).

The circuit according to this embodiment is designed such that as for the currents discharged from the drains of the first transistor Q1 and the second transistor Q2 at this instant, the current from the first transistor Q1 is 0.6/R(A), and the current from the second transistor Q2 is 0.2/R(A).

As a result, the current that can be passed to the load is 0.4/R(A), which is equal to the current discharged from the first transistor Q1, minus the amount of current that can be fully drawn by the third transistor Q3.

This is also equal to the current that is drawn by the fourth transistor Q4, minus the amount of current that can be fully handled by the second transistor Q2.

On the other hand, since the total current that flows through the output circuit is 0.8/R(A), the current that can be passed to drive the load is half of the total consumption current.

Next, a case is considered in which there are the fifth and sixth resistors R5 and R6.

It is supposed here that the maximum voltage and the minimum voltage of the source voltage S3 of the third transistor Q3 and the source voltage S4 of the fourth transistor Q4 are also 0.6 (V) and 0.2 (V).

The current that flows from the drain of the third transistor Q3 to the source at the instant when the source voltage S3 is the minimum voltage and the source voltage S4 is the maximum voltage is the following value.

That is, the current that flows from the drain of the third transistor Q3 to the source is a value obtained by subtracting a current of 0.4/r(A) that is supplied to the source of the third transistor Q3 through the sixth resistor R6, from a current of 0.2/R(A) that flows to the ground potential GND through the source, for example.

The current that flows from the drain of the fourth transistor Q4 to the source at the same instant is a value obtained by adding a current of 0.4/r(A) flowing through the sixth resistor R6, to a current of 0.6/R(A) flowing through the fourth resistor R4.

Since the current that flows out from the drain of the first transistor Q1 is equal to the current that is drawn from the drain of the fourth transistor Q4, the current that is caused to flow into the load from the junction of the first transistor Q1 and the third transistor Q3 is 0.4/R+0.8/r(A).

Since the current that flows out from the drain of the second transistor Q2 is equal to the current that is drawn from the drain of the third transistor Q3, the current that flows into the junction of the second transistor Q2 and the fourth transistor Q4 from the load is also 0.4/R+0.8/r(A).

While the total consumption current of the output circuit at this time is 0.8/R(A) that is the same as that when the fifth resistor R5 and the sixth resistor R6 are not provided, the current that can be passed to the load increases by 0.8/r(A).

In terms of calculation, when r=2R, the load driving current becomes equal to the circuit consumption current and the entirety of the consumption current can be made to contribute to driving the load. However, in actuality, the current of the transistor becoming 0 is not preferable because the feedback loop for making the source potential match a target potential becomes open.

The resistance r is adjusted so as to leave in the transistor at least a current for maintaining the feedback loop.

Third Embodiment

Figure 3:
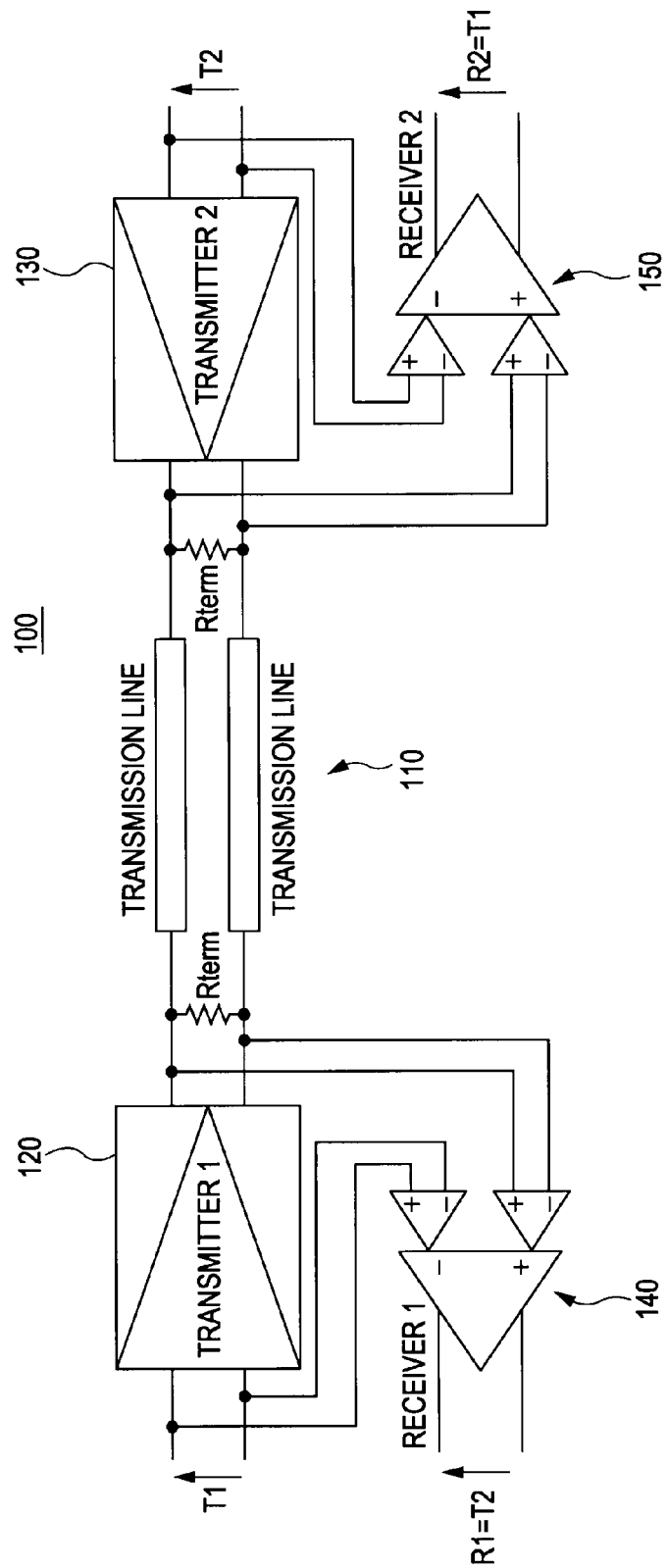
FIG. 3 is a diagram showing a configuration of a communication device according to a third embodiment of the present invention.

FIG. 3 is a diagram showing a configuration of a communication device according to a third embodiment of the present invention.

A communication device 100 in FIG. 3 has in each of its transmitter a driver including a differential drive circuit according to an embodiment of the present invention.

The communication device 100 has transmitters 120 and 130 arranged on both sides of a differential transmission line 110, and is configured to be capable of two-way communication.

The transmitters 120 and 130 each include the above-described differential drive circuit 2 or 2A according to the first or second embodiment.

The communication device 100 has receivers 140 and 150 arranged in parallel to the transmitters 120 and 130, respectively, with respect to the differential transmission line 110.

The differential transmission line 110 is connected with a terminating resistor Rterm at either end.

Since a differential drive circuit according to an embodiment of the present invention can output the same current as the target current to a load without regard to the voltage of the load, there is no interference with the output state of the transmitter at the other end.

Therefore, a perfect sum signal of signals to be outputted by the transmitters 120 and 130 at both ends is generated across the load.

Each of the receivers 140 and 150 provided at both ends of the differential transmission line 110 so as to be in parallel with the transmitters 120 and 130 can obtain a signal of the transmitter at the other end by subtracting the target output of each of the transmitters 120 and 130 arranged in parallel with the receivers 140 and 150 from the sum signal generated across the load.

As described above, this embodiment provides negative feedback (NFB) that matches the source potential of each of the transistors Q1 to Q4 as output transistors with a drive target voltage value. Thus, a target current can be accurately outputted even in the event of disturbances in drain potential.

This is advantageous in that in the case of, for example, two-way multiplexing performed in Ethernet (R) 1000 BASE-T, an accurate output current can be obtained independently of the reception waveform, and an accurate sum signal of transmission/reception signals can be generated without distortion.

Also, according to this embodiment, the following effects can be attained.

A differential signal with desired common-mode component can be outputted even when the gate voltage-drain current characteristic of MOS transistors (field effect transistor) is not linear or differs between PMOS and NMOS.

Also, in this embodiment, due to the good linearity between a drive target voltage given as an input and an output voltage, a waveform that is strictly regulated for restricting the bandwidth can be correctly sent to the load.

Further, this embodiment also has an advantage in that the ratio of the load driving current to the consumption current at the output stage can be set large, thus providing excellent power efficiency.

Also, current that is proportional to a target drive voltage can be outputted accurately independently of the condition of a load. By observing the voltage of the load, and subtracting away a constant multiple of target drive current by computation, it can be identified that the second drive circuit applies current to the load. This makes it possible to perform two-way communication by a single load, that is, a single transmission line.

Also, in the differential drive circuit according to this embodiment, there are only one transistor stage and one resistor between the output terminal (output node) and each of the reference potential VSS (for example, the ground potential GND) and the power supply potential VDD.

This enables operation by a lower voltage than in the case of the circuit disclosed in Japanese Unexamined Patent Application Publication 2006-345259 or the like which employs a so-called vertical stacking of current source transistors and differential transistors.

In the foregoing, a driver including a differential drive circuit has been described as the first and second embodiments, and a communication device including the driver has been described as the third embodiment.

Hereinbelow, a description will be given of another configuration of the driver 1 including a differential drive circuit according to the first embodiment, another configuration of the driver 1A including a differential drive circuit according to the second embodiment, and another configuration of the communication device 100 according to the third embodiment.

First, another configuration of the driver 1 including a differential drive circuit according to the first embodiment will be described as fourth to tenth embodiments, with reference to FIGS. 4 to 11.

Fourth Embodiment

Figure 4:
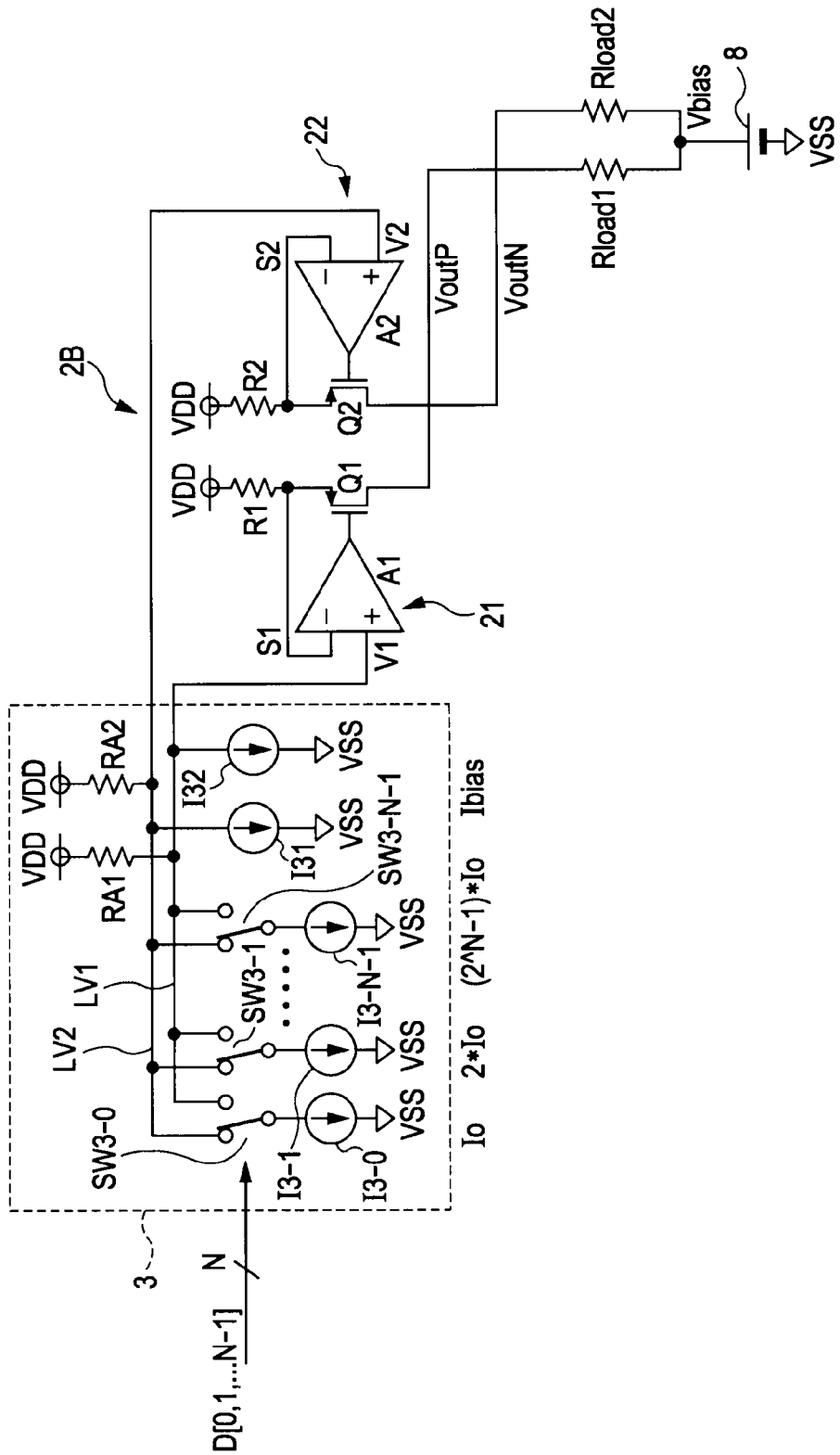
FIG. 4 is a circuit diagram showing a configuration of a driver including a differential drive circuit according to a fourth embodiment of the present invention.

FIG. 4 is a circuit diagram showing a configuration of a driver including a differential drive circuit according to a fourth embodiment of the present invention.

A driver 1B according to the fourth embodiment differs from the driver 1 according to the first embodiment in that the drive of a load is performed by using only a pull-up circuit as a first drive system.

Specifically, the driver 1B in FIG. 4 uses, among the components of the driver 1 in FIG. 1, the PMOS transistors Q1 and Q2, the first and second circuits 21 and 22, the resistors R1 and R2, and the DAC 3 to perform the drive of a load.

The drains of the PMOS transistors Q1 and Q2 are respectively connected to load resistances Rload1 and Rload2, and the load resistances Rload1 and Rload2 are connected to a power supply 8 of a bias voltage Vbias.

According to the fourth embodiment, there is provided negative feedback (NFB) that matches the source potential of each of the transistors Q1 and Q2 as output transistors with a drive target voltage value. Thus, a target current can be accurately outputted even in the event of disturbances in drain potential.

Fifth Embodiment

Figure 5:
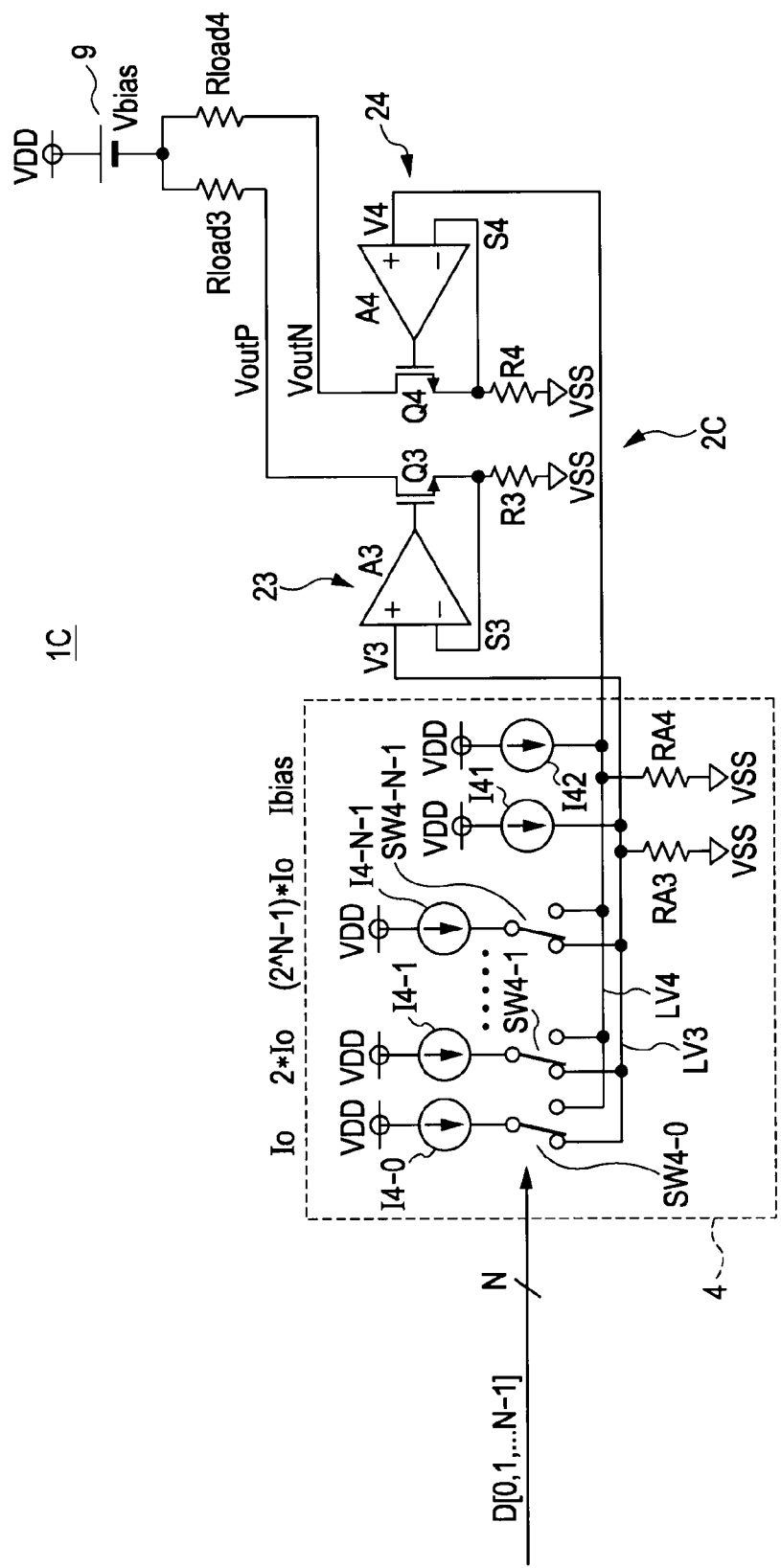
FIG. 5 is a circuit diagram showing a configuration of a driver including a differential drive circuit according to a fifth embodiment of the present invention.

FIG. 5 is a circuit diagram showing a configuration of a driver including a differential drive circuit according to a fifth embodiment of the present invention.

A driver 1C according to the fifth embodiment differs from the driver 1 according to the first embodiment in that the drive of a load is performed by using only a pull-down circuit as a second drive system.

Specifically, the driver 1C in FIG. 5 uses, among the components of the driver 1 in FIG. 1, the NMOS transistors Q3 and Q4, the third and fourth circuits 23 and 24, the resistors R3 and R4, and the DAC 4 to perform the drive of a load.

The drains of the NMOS transistors Q3 and Q4 are respectively connected to load resistances Rload3 and Rload4, and the load resistances Rload3 and Rload4 are connected to a power supply 9 of a bias voltage Vbias.

According to the fifth embodiment, there is provided negative feedback (NFB) that matches the source potential of each of the transistors Q3 and Q4 as output transistors with a drive target voltage value. Thus, a target current can be accurately outputted even in the event of disturbances in drain potential.

Sixth Embodiment

Figure 6:
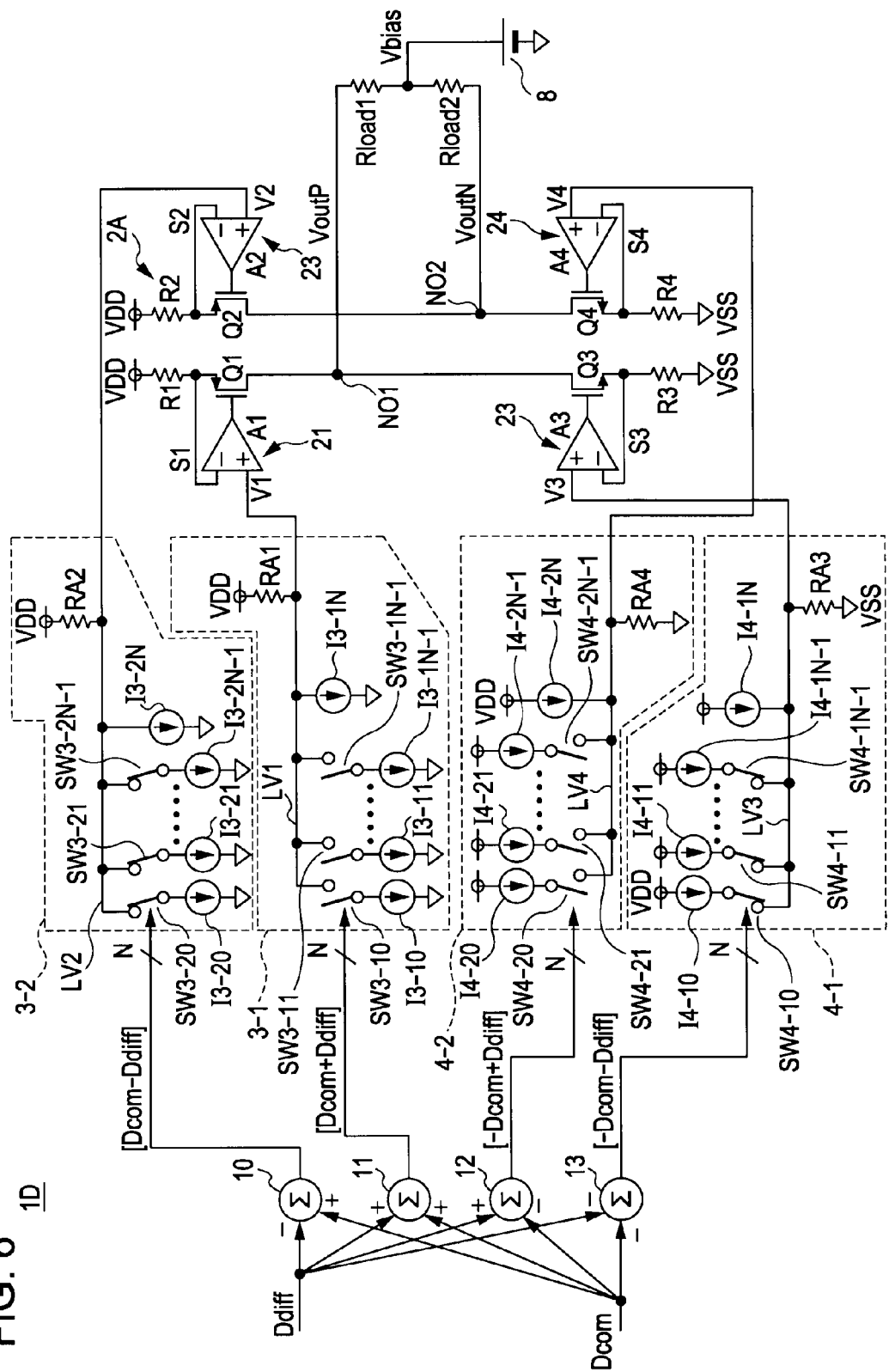
FIG. 6 is a circuit diagram showing a configuration of a driver including a differential drive circuit according to a sixth embodiment of the present invention.

FIG. 6 is a circuit diagram showing a configuration of a driver including a differential drive circuit according to a sixth embodiment of the present invention.

A driver 1D according to the sixth embodiment differs from the driver 1 according to the first embodiment in that the differential voltage and common-mode voltage of outputs are outputted in accordance with numerical values Ddiff and Dcom that are given.

Accordingly, the DAC 3 on the pull-up side is split into two DACs, a first DAC 3-1 and a second DAC 3-2, and the DAC 4 on the pull-down side is split into two DACs, a third DAC 4-1 and a fourth DAC 4-2.

Adder/subtractors 10, 11, 12, and 13 that each add/subtract the numerical values Ddiff and Dcom are arranged at the input stages of the respective DACs 3-1, 3-2, 4-1, and 4-2. Thus, different numerical values are inputted to the respective DACs 3-1, 3-2, 4-1, and 4-2.

The first and second output nodes NO1 and NO2 of a differential drive circuit 2D are respectively connected to the load resistances Rload1 and Rload2. The load resistances Rload1 and Rload2 are connected to the power supply 8 of a bias voltage Vbias.

The adder/subtractor 10 receives an input of the numerical value Ddiff as a negative input, and receives an input of the numerical value Dcom as a positive input. The adder/subtractor 10 obtains an N-bit numerical value [Dcom−Ddiff] by a computation on the inputs, and supplies this numerical value [Dcom−Ddiff] to the DAC 3-2.

The adder/subtractor 11 receives an input of the numerical value Ddiff as a first positive input, and receives an input of the numerical value Dcom as a second positive input. The adder/subtractor 11 obtains an N-bit numerical value [Dcom+Ddiff] by a computation on the inputs, and supplies this numerical value [Dcom+Ddiff] to the DAC 3-1.

The adder/subtractor 12 receives an input of the numerical value Ddiff as a positive input, and receives an input of the numerical value Dcom as a negative input. The adder/subtractor 12 obtains an N-bit numerical value [−Dcom+Ddiff] by a computation on the inputs, and supplies this numerical value [−Dcom+Ddiff] to the DAC 4-2.

The adder/subtractor 13 receives an input of the numerical value Ddiff as a first negative input, and receives an input of the numerical value Dcom as a second negative input. The adder/subtractor 13 obtains an N-bit numerical value [−Dcom−Ddiff] by a computation on the inputs, and supplies this numerical value [−Dcom−Ddiff] to the DAC 4-1.

The DAC 3-1 has switches SW3-10 to SW3-1N-1, and current sources I3-10 to I3-1N.

As shown in FIG. 6, the current sources I3-10 to I3-1N-1 and the switches SW3-10 to SW3-1N-1 are connected serially in pairs between the power supply potential source VDD and the first supply line LV1. The current source I3-1N is connected between the power supply potential source VDD and the first supply line LV1.

The numerical value [Dcom+Ddiff] is supplied to the control gates of the current sources I3-10 to I3-1N.

The DAC 3-2 has switches SW3-20 to SW3-2N-1, and current sources I3-20 to I3-2N.

As shown in FIG. 6, the current sources I3-20 to I3-2N-1 and the switches SW3-20 to SW3-2N-1 are connected serially in pairs between the power supply potential source VDD and the second supply line LV2. The current source I3-2N is connected between the power supply potential source VDD and the second supply line LV2.

The numerical value [Dcom−Ddiff] is supplied to the control gates of the current sources I3-20 to I3-2N.

The DAC 4-1 has switches SW4-10 to SW4-1N-1, and current sources I4-10 to I4-1N.

As shown in FIG. 6, the current sources I4-10 to I4-1N-1 and the switches SW4-10 to SW4-1N-1 are connected serially in pairs between the power supply potential source VDD and the third supply line LV3. The current source I4-1N is connected between the power supply potential source VDD and the third supply line LV3.

The numerical value [−Dcom−Ddiff] is supplied to the control gates of the current sources I4-10 to I4-1N.

The DAC 4-2 has switches SW4-20 to SW4-2N-1, and current sources I4-20 to I4-2N.

As shown in FIG. 6, the current sources I4-20 to I4-2N-1 and the switches SW4-20 to SW4-2N-1 are connected serially in pairs between the power supply potential source VDD and the fourth supply line LV4. The current source I4-2N is connected between the power supply potential source VDD and the fourth supply line LV4.

The numerical value [−Dcom+Ddiff] is supplied to the control gates of the current sources I4-20 to I4-2N.

In the driver 1D, the drive target potential V1 is given to the resistor R1 and the PMOS transistor Q1 that pull up the first output node NO1 (output VoutP), and the drive target potential V3 is given to the resistor R3 and the NMOS transistor Q3 that pull down the first output node NO1 (output VoutP).

Also, the drive target potential V2 is given to the resistor R2 and the PMOS transistor Q2 that pull up the second output node NO2 (output VoutP), and the drive target potential V4 is given to the resistor R4 and the NMOS transistor Q4 that pull down the second output node NO2 (output VoutP).

The drive target potentials V1 to V4 are generated by the four DACs, the DACs 3-1, 3-2, 4-1, and 4-2.

As digital inputs to the DACs 3-1, 3-2, 4-1, and 4-2, [Dcom+Ddiff], [Dcom−Ddiff], [−Dcom−Ddiff], and [−Dcom+Ddiff] are given with respect to two pieces of numeric data Ddiff and Dcom.

Supposing that analog voltage values corresponding to Ddiff and Dcom are Vdiff and Vcom, the following relationships hold.

[Eq. 6]

$$VDD-V1 = +V\text{diff} + V\text{com}$$

$$VDD-V2 = -V\text{diff} + V\text{com}$$

$$V3-GND = -V\text{diff} - V\text{com}$$

$$V4-GND = +V\text{diff} - V\text{com}$$

When the resistance values of the resistors R1 to R4 are all R, an output current IQ1 of the PMOS transistor Q1, an output current IQ3 of the NMOS transistor Q3, and a current IVoutP that goes toward the load from the first output node NO1 are given by the following equations.

[Eq. 7]

$$IQ1 = (+V\text{diff} + V\text{com})/R$$

$$IQ3 = (-V\text{diff} - V\text{com})/R$$

$$IV\text{out}P = 2 \cdot (+V\text{diff} + V\text{com})/R$$

Likewise, when the resistance values of the resistors R1 to R4 are all R, an output current IQ2 of the PMOS transistor Q2, an output current IQ4 of the NMOS transistor Q4, and a current IVoutN that goes toward the load from the second output node NO2 are given by the following equations.

[Eq. 8]

$$IQ2 = (-V\text{diff} + V\text{com})/R$$

$$IQ4 = (+V\text{diff} - V\text{com})/R$$

$$IV\text{out}N = 2 \cdot (-V\text{diff} + V\text{com})/R$$

The potential VoutP on the first output node NO1 side, and the potential VoutN on the second output node NO2 side are given by the following equations.

[Eq. 9]

$$VoutP = Vbias + 2 \cdot Rload \cdot (+Vdiff + Vcom)/R$$

$$VoutN = Vbias + 2 \cdot Rload \cdot (-Vdiff + Vcom)/R$$

Therefore, a differential voltage VDPN and a common-mode voltage VIPN of the outputs VoutP and VoutN are as follows.

[Eq. 10]

$$VDPN = 4 \cdot Rload \cdot Vdiff/R$$

$$VIPN = Vbias + 2 \cdot Rload \cdot Vcom/R$$

This means that the differential voltage VDPN and the common-mode voltage VIPN of outputs are outputted in accordance with the numerical values Ddiff and Dcom.

Even when factoring in such common-mode voltage drive, the circuit according to an embodiment of the present invention accurately controls currents flowing through the resistors R1 to R4, that is, currents outputted from the transistors Q1 to Q4, so the differential output can be outputted accurately without being modulated or distorted depending on the level of the common-mode output.

According to the sixth embodiment, there is provided negative feedback (NFB) that matches the source potential of each of the transistors Q1 to Q4 as output transistors with a drive target voltage value. Thus, a target current can be accurately outputted even in the event of disturbances in drain potential.

A differential signal with desired common-mode component can be outputted even when the gate voltage-drain current characteristic of MOS transistors (field effect transistor) is not linear or differs between PMOS and NMOS.

Also, in the sixth embodiment, due to the good linearity between a drive target voltage given as an input and an output voltage, a waveform that is strictly regulated for restricting the bandwidth can be correctly sent to the load.

Further, the sixth embodiment also has an advantage in that the ratio of the load driving current to the consumption current at the output stage can be set large, thus providing excellent power efficiency.

Also, a current that is proportional to a target drive voltage can be outputted accurately independently of the condition of the load.

Also, the differential output can be outputted accurately without being modulated or distorted depending on the level of the common-mode output.

Seventh Embodiment

Figure 7:
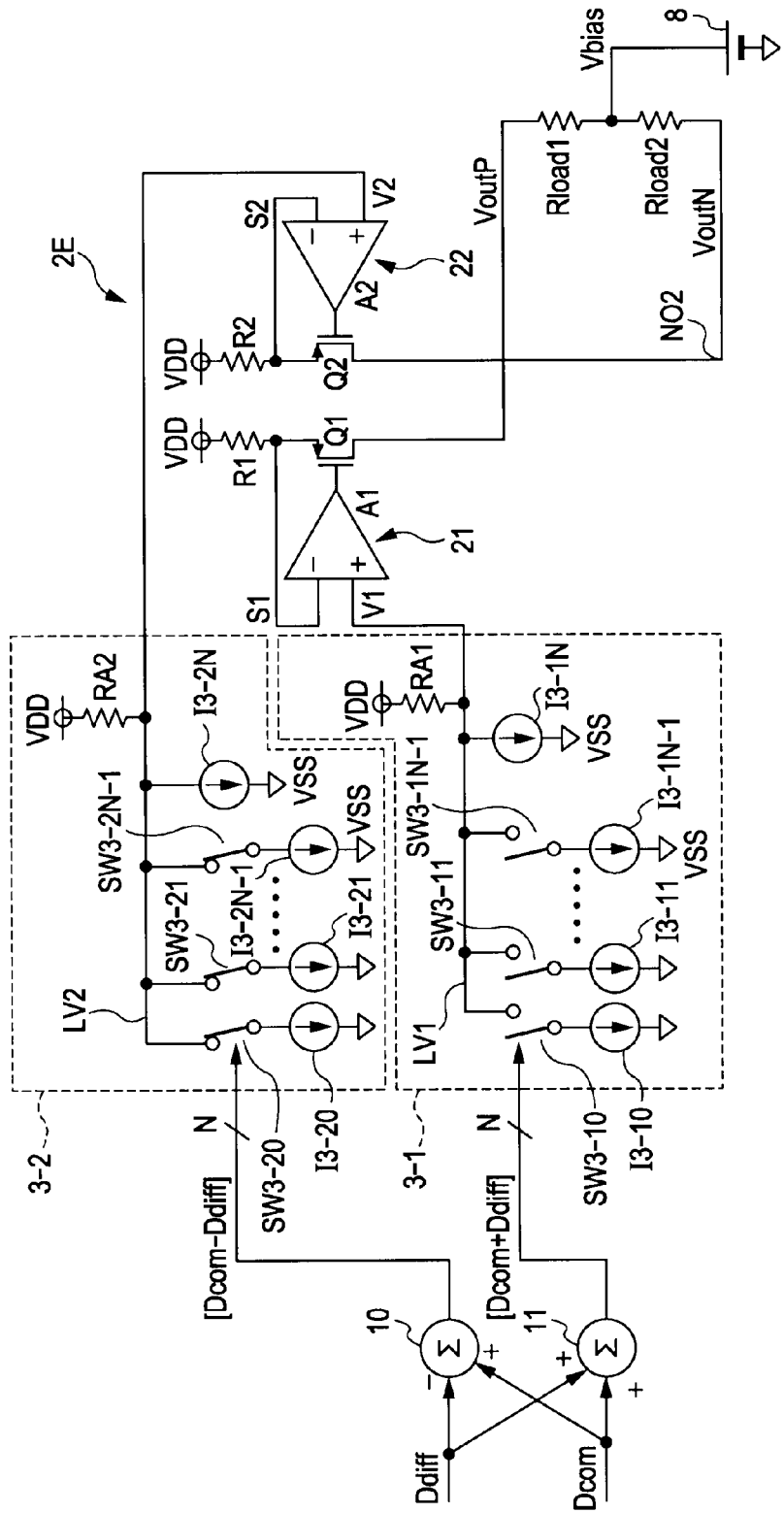
FIG. 7 is a circuit diagram showing a configuration of a driver including a differential drive circuit according to a seventh embodiment of the present invention.

FIG. 7 is a circuit diagram showing a configuration of a driver including a differential drive circuit according to a seventh embodiment of the present invention.

A driver 1E according to the seventh embodiment differs from the driver 1D according to the sixth embodiment in that the drive of a load is performed by using only a pull-up circuit as the first drive system.

Specifically, the driver 1E in FIG. 7 uses, among the components of the driver 1D in FIG. 6, the PMOS transistors Q1 and Q2, the first and second circuits 21 and 22, the resistors R1 and R2, the DACs 3-1 and 3-2, and the adder/subtractors 10 and 11 to perform the drive of a load.

The drains of the PMOS transistors Q1 and Q2 are respectively connected to the load resistances Rload1 and Rload2, and the load resistances Rload1 and Rload2 are connected to the power supply 8 of a bias voltage Vbias.

According to the seventh embodiment, there is provided negative feedback (NFB) that matches the source potential of each of the transistors Q1 and Q2 as output transistors with a drive target voltage value. Thus, a target current can be accurately outputted even in the event of disturbances in drain potential.

Also, the differential voltage VDPN and common-mode voltage VIPN of outputs can be outputted in accordance with the numerical values Ddiff and Dcom.

In this case, the differential output can be outputted accurately without being modulated or distorted depending on the level of the common-mode output.

Eighth Embodiment

Figure 8:
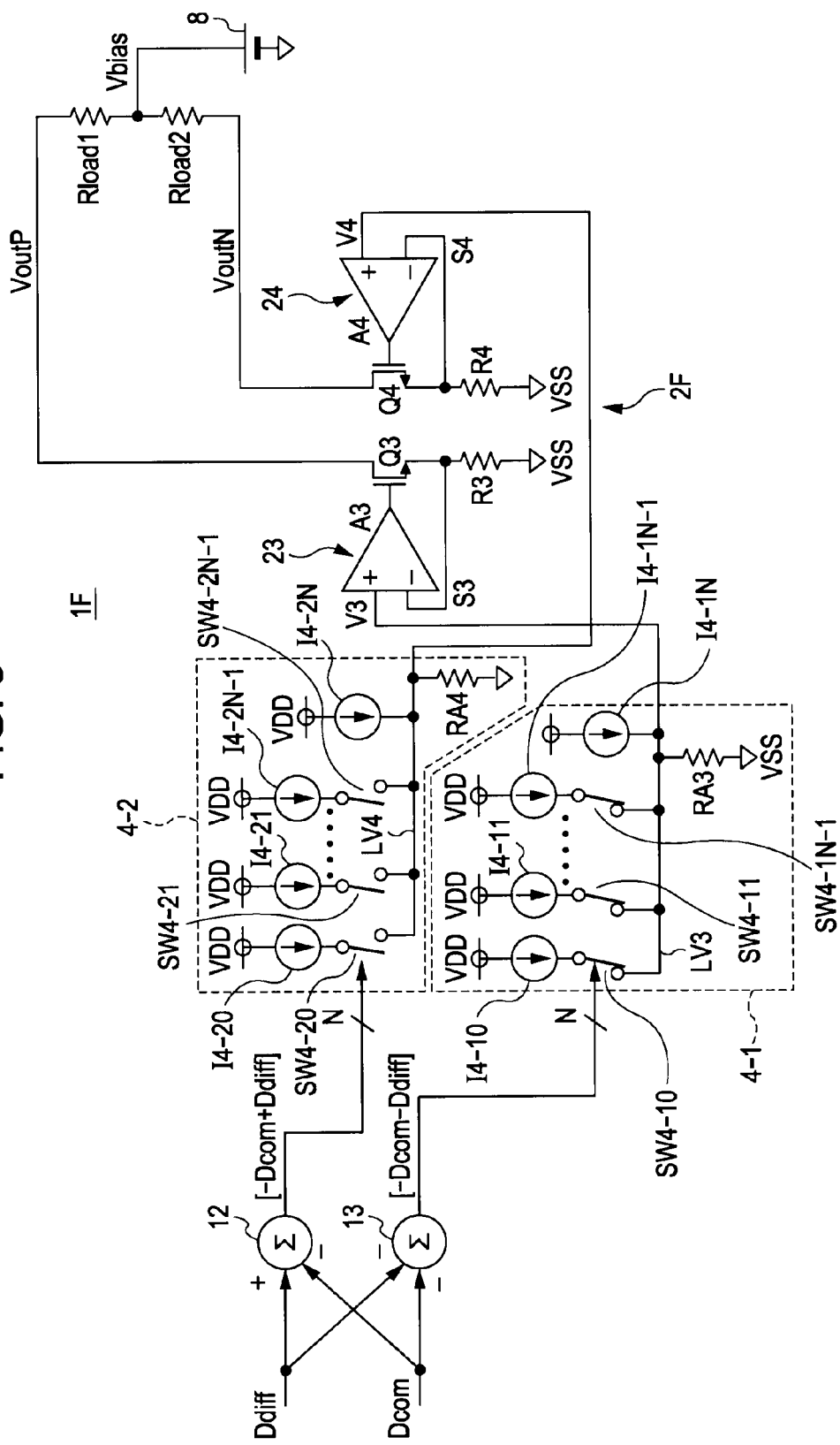
FIG. 8 is a circuit diagram showing a configuration of a driver including a differential drive circuit according to an eighth embodiment of the present invention.

FIG. 8 is a circuit diagram showing a configuration of a driver including a differential drive circuit according to an eighth embodiment of the present invention.

A driver 1F according to the eighth embodiment differs from the driver 1D according to the sixth embodiment in that the drive of a load is performed by using only a pull-down circuit as the second drive system.

Specifically, the driver 1F in FIG. 8 uses, among the components of the driver 1D in FIG. 6, the NMOS transistors Q3 and Q4, the third and fourth circuits 23 and 24, the resistors R3 and R4, the DACs 4-1 and 4-2, and the adder/subtractors 12 and 13 to perform the drive of a load.

The drains of the NMOS transistors Q3 and Q4 are respectively connected to the load resistances Rload1 and Rload2, and the load resistances Rload1 and Rload2 are connected to the power supply 8 of a bias voltage Vbias.

According to the eighth embodiment, there is provided negative feedback (NFB) that matches the source potential of each of the transistors Q3 and Q4 as output transistors with a drive target voltage value. Thus, a target current can be accurately outputted even in the event of disturbances in drain potential.

Also, the differential voltage VDPN and common-mode voltage VIPN of outputs can be outputted in accordance with the numerical values Ddiff and Dcom.

In this case, the differential output can be outputted accurately without being modulated or distorted depending on the level of the common-mode output.

Ninth Embodiment

Figure 9:
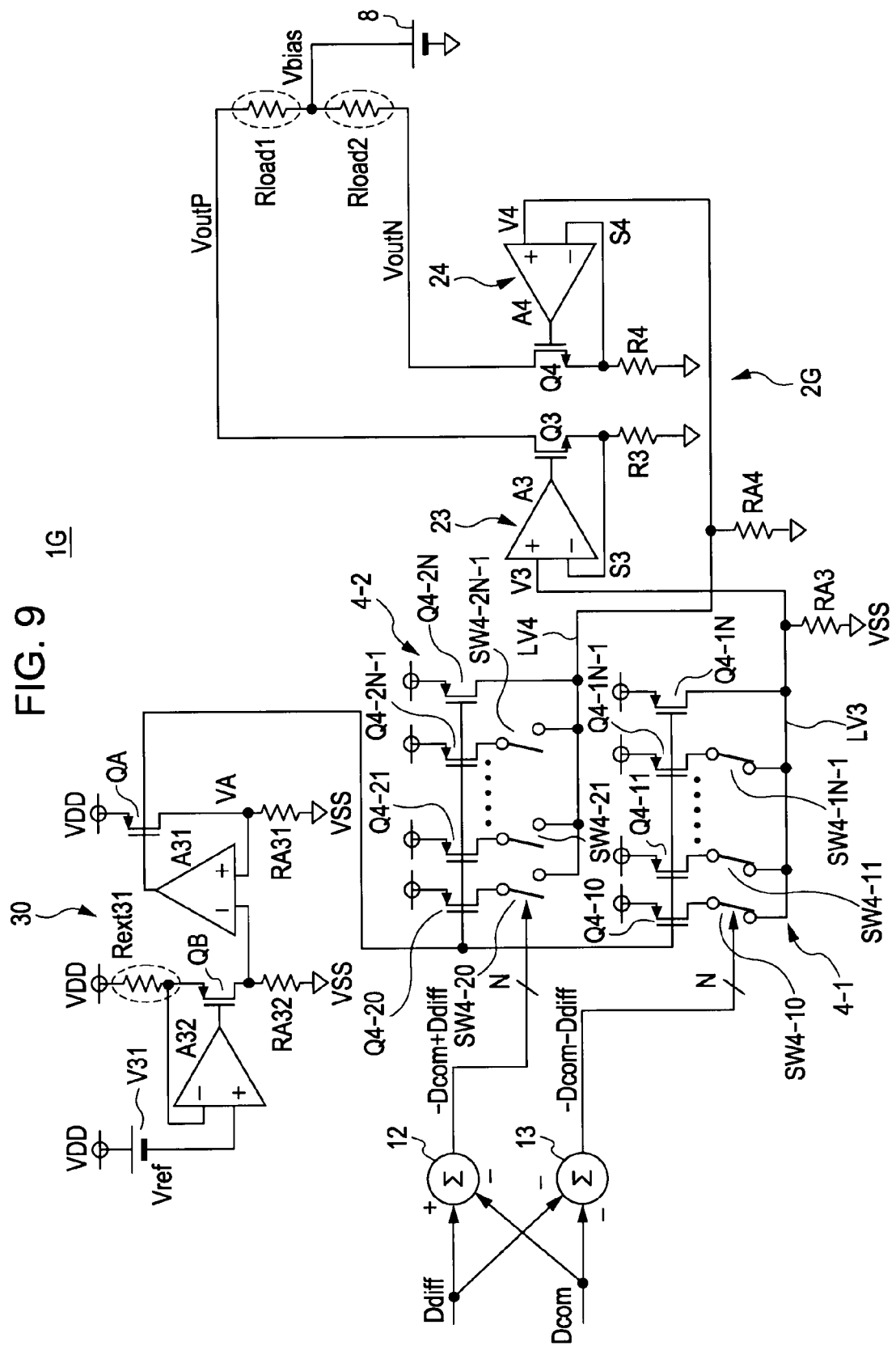
FIG. 9 is a circuit diagram showing a configuration of a driver including a differential drive circuit according to a ninth embodiment of the present invention.

FIG. 9 is a circuit diagram showing a configuration of a driver including a differential drive circuit according to a ninth embodiment of the present invention.

A driver 1G according to the ninth embodiment differs from the driver 1F according to the eighth embodiment in that the driver 1G has a stabilizing circuit 30 for DAC to stabilize the output.

The stabilizing circuit 30 for DAC has PMOS transistors QA and QB, operational amplifiers A31 and A32, resistors RA31 and RA32, and a referenced resistor Rext31, and a power supply V31.

The source of the PMOS transistor QA is connected to the power supply potential source VDD, the drain is connected to one end of the resistor RA31 and the non-inverting input terminal (+) of the operational amplifier A31. The other end of the resistor RA31 is connected to the reference potential source VSS.

The gate of the PMOS transistor QA is connected to the output of the operational amplifier A31.

The source of the PMOS transistor QB is connected to one end of the referenced resistor Rext31 and the inverting input terminal (−) of the operational amplifier A32.

The drain of the PMOS transistor QB is connected to one end of the resistor RA32 and the inverting input terminal (−) of the operational amplifier A31.

The gate of the PMOS transistor QB is connected to the output of the operational amplifier A32. The other end of the referenced resistor Rext31 is connected to the power supply potential source VDD, and the other end of the resistor RA32 is connected to the reference potential source VSS.

The non-inverting input (+) of the operational amplifier A32 is connected to the power supply V31 that supplies a reference voltage Vref.

The DAC 4-1 has the switches SW4-10 to SW4-1N-1, and PMOS transistors Q4-10 to Q4-1N as current sources.

As shown in FIG. 9, the PMOS transistors Q4-10 to Q4-1N-1 and the switches SW4-10 to SW4-1N-1 are connected serially in pairs between the power supply potential source VDD and the third supply line LV3. The source of the PMOS transistor Q4-1N is connected to the power supply potential source VDD, and the drain is connected to the third supply line LV3.

The gates of the PMOS transistors Q4-10 to Q4-1N are connected to the output of the operational amplifier A31 of the stabilizing circuit 30.

The DAC 4-2 has the switches SW4-20 to SW4-2N-1, and PMOS transistors Q4-20 to Q4-2N as current sources.

As shown in FIG. 9, the PMOS transistors Q4-20 to Q4-2N-1 and the switches SW4-20 to SW4-2N-1 are connected serially in pairs between the power supply potential source VDD and the fourth supply line LV4. The source of the PMOS transistor Q4-2N is connected to the power supply potential source VDD, and the drain is connected to the fourth supply line LV4.

The gates of the PMOS transistors Q4-20 to Q4-2N are connected to the output of the operational amplifier A31 of the stabilizing circuit 30.

In the stabilizing circuit 30, the transistor QA and the resistor RA31 serve as replicas of the DACs 4-1 and 4-2 that produce the drive target voltages V3 and V4. The stabilizing circuit 30 including these replicas outputs the same output VA as that outputted when a certain numeric input is given to each of the DACs 4-1 and 4-2.

Negative feedback (NFB) is applied to the output VA so as to attain the relationship represented by the following equation.

[Eq. 11]

$$VA = Vref \cdot (RA/Rext)$$

Therefore, the output when a specific numeric value is inputted to each of the DACs 4-1 and 4-2 also becomes VA.

The transconductance at the output stage is 1/R provided that R=R3=R4, so the output potential is as follows.

[Eq. 12]

$$VA \cdot Rload/R = Vref \cdot (RA/R) \cdot (Rload/Rext)$$

Supposing that the resistor RA31 and the resistors R3 and R4 are both resistances in the same integrated circuit and their ratio is substantially constant, and the load resistances Rloads 1 and 2 and the referenced resistor Rext31 are both high-accuracy resistances outside the integrated circuit, their ratio is also constant.

Therefore, the output when a specific numerical value is inputted to each of the DACs 4-1 and 4-2 is an integer multiple of the reference voltage Vref.

If the reference voltage Vref is a stable voltage given by a bandgap reference output or a trimmed bias generating circuit, this means that the output of the driver 1G according to the ninth embodiment when a specific numerical input is given is stabilized.

The same stabilizing circuit is also applicable to the driver 1 in FIG. 1, the driver 1B in FIG. 4, the driver 1C in FIG. 5, the driver 1D in FIG. 6, and the driver 1E in FIG. 7.

According to the ninth embodiment, there is provided negative feedback (NFB) that matches the source potential of each of the transistors Q3 and Q4 as output transistors with a drive target voltage value. Thus, a target current can be accurately outputted even in the event of disturbances in drain potential.

Also, the differential voltage VDPN and common-mode voltage VIPN of outputs can be outputted in accordance with the numerical values Ddiff and Dcom.

In this case, the differential output can be outputted accurately without being modulated or distorted depending on the level of the common-mode output.

Also, the output when a specific numeric input is given can be stabilized.

Tenth Embodiment

Figure 10:
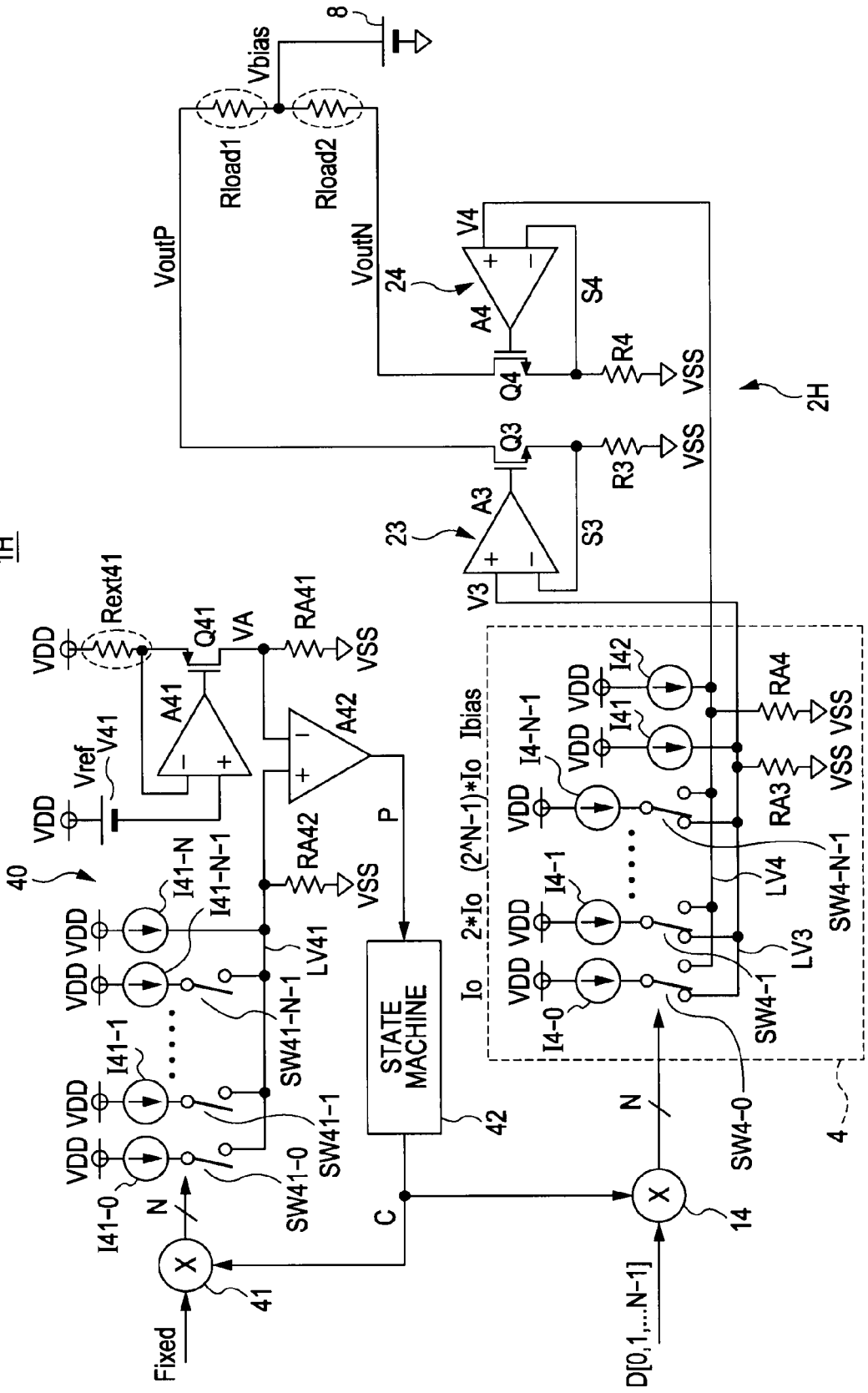
FIG. 10 is a circuit diagram showing a configuration of a driver including a differential drive circuit according to a tenth embodiment of the present invention.

FIG. 10 is a circuit diagram showing a configuration of a driver including a differential drive circuit according to a tenth embodiment of the present invention.

A driver 1H according to the tenth embodiment differs from the driver 1C according to the fifth embodiment in that a multiplier 14 that multiples an input by a coefficient C is arranged at an upstream stage of the DAC so that the output with respect to a specific numeric input becomes constant.

The coefficient C is generated by a stabilizing circuit 40 having the function of replicating the DAC.

The stabilizing circuit 40 has a PMOS transistor Q41, resistors RA41 and RA42, a referenced resistor Rext41, operational amplifiers A41 and A42, and a power supply V41.

The stabilizing circuit 40 further has switches SW41-0 to SW41-N-1, current sources I41-0 to I41-N, a supply line LV41, a multiplier 41, and a state machine 42.

The source of the PMOS transistor Q41 is connected to one end of the reference transistor Rext41 and the inverting input terminal (−) of the operational amplifier A41.

The drain of the PMOS transistor Q41 is connected to one end of the resistor RA41 and the inverting input terminal (−) of the operational amplifier A42.

The gate of the PMOS transistor Q41 is connected to the output of the operational amplifier A41. The other end of the referenced resistor Rext41 is connected to the power supply potential source VDD, and the other end of the resistor RA41 is connected to the reference potential source VSS.

The non-inverting input (+) of the operational amplifier A41 is connected to the power supply V41 that supplies the reference voltage Vref.

The non-inverting input (+) of the operational amplifier A42 is connected to the supply line LV41.

One end of the resistor RA42 is connected to the supply line LV41, and the other end is connected to the reference potential source VSS.

As shown in FIG. 10, the current sources I41-0 to I41-N-1 and the switches SW41-10 to SW41-1N-1 are connected serially in pairs between the power supply potential source VDD and the supply line LV41. The current source I41-1N is connected between the power supply potential source VDD and the supply line LV41.

N-bit data for ON/OFF control, which is obtained by multiplying a fixed value by the coefficient C, is supplied to the control gates of the switches SW41-10 to SW41-1N-1.

The multiplier 41 supplies the N-bit data obtained by multiplying a fixed value by the coefficient C, to the control gates of the switches SW41-10 to SW41-1N-1.

The state machine 42 retrieves a value of the coefficient C at which the output level P of the operational amplifier A42 as a comparator changes from 0 to 1, by scanning from the minimum value. The state machine 42 supplies the retrieved coefficient C to the multipliers 41 and 14.

Figure 11:
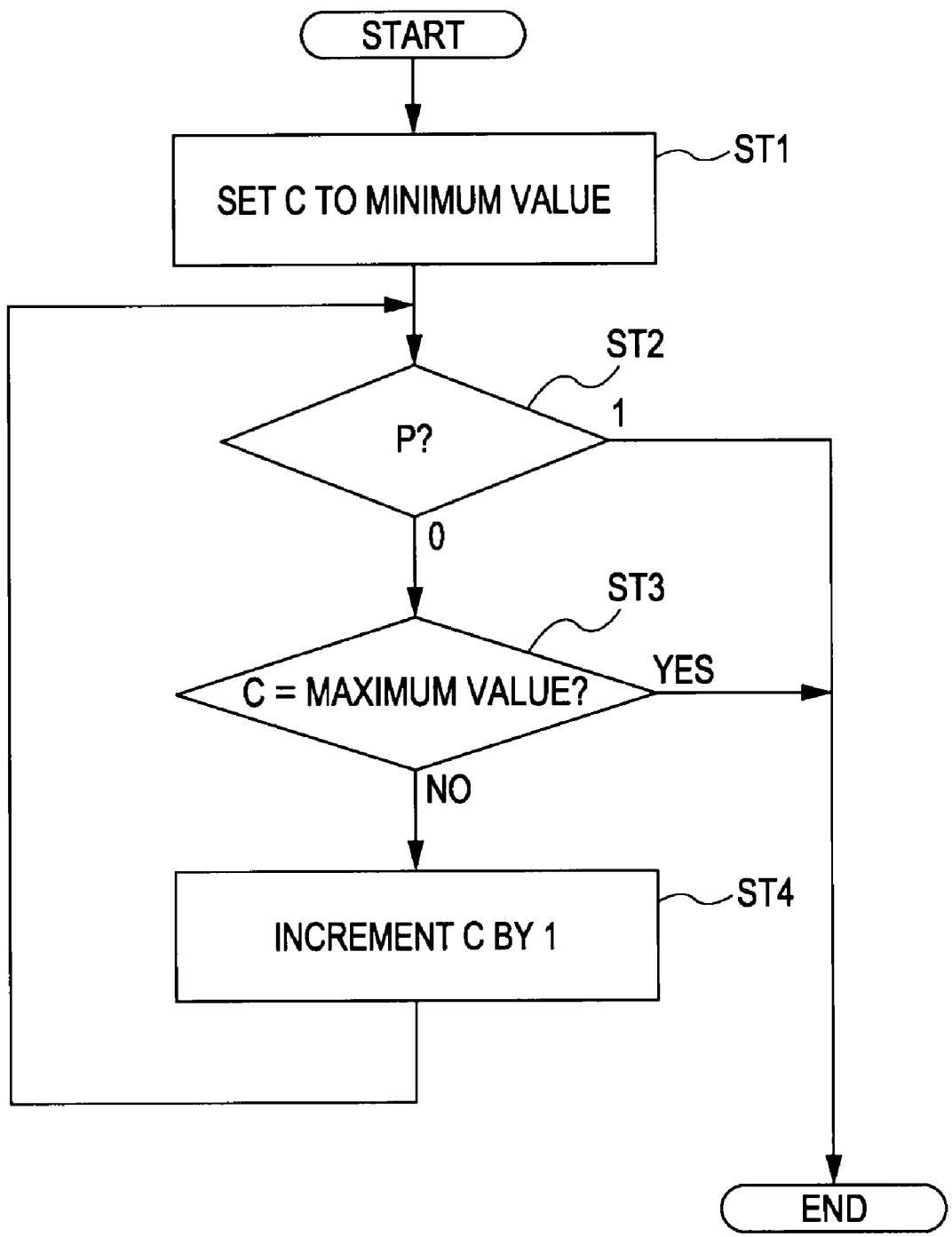
FIG. 11 is a flowchart showing the operation of a state machine in FIG. 10.

FIG. 11 is a flowchart showing an operation of the state machine of the stabilizing circuit according to the tenth embodiment.

First, the state machine 42 sets the coefficient C to the minimum value (ST1).

Next, the state machine 42 determines whether or not the output P of the operational amplifier A42 is 0 or 1 (ST2).

If it is determined in step ST2 that the output P is 0, the state machine 42 determines whether or not the coefficient C is the maximum value (ST3).

If it is determined in step ST3 that the coefficient C is not the maximum value, the state machine 42 adds 1 to the value of the coefficient C, and repeats the process from step ST2.

Then, upon determining in step ST2 that the output P is 1, the state machine 42 terminates the process.

The state machine 42 also terminates the process upon determining in step ST3 that the coefficient C has reached the maximum value.

In this way, the state machine 42 scans the coefficient C from the minimum value, and finds a value of the coefficient C at which the comparator output changes from 0 to 1.

The output of the stabilizing circuit 40 including a DAC replica function to which a value obtained by multiplying a fixed value Fixed by the coefficient C is inputted is generally represented as follows.

[Eq. 13]

$$VA = Vref \cdot (RA/R)$$

A differential drive circuit 2H as an output circuit that is given the same numeric input as mentioned above also outputs the same voltage as VA for the drive target voltage V3 or V4 since the numerical value is multiplied by the coefficient C at the input of the DAC 4. Supposing that R=R3=R4, the output voltage at that time is obtained as follows and is thus stabilized to a constant value.

[Eq. 14]

$$VA \cdot (Rload/R) = Vref \cdot (RA/R) \cdot (Rload/Rext)$$

The same stabilizing circuit is also applicable to the driver 1 in FIG. 1, the driver 1B in FIG. 4, the driver 1C in FIG. 5, the driver 1D in FIG. 6, and the driver 1E in FIG. 7.

According to the tenth embodiment, there is provided negative feedback (NFB) that matches the source potential of each of the transistors Q3 and Q4 as output transistors with a drive target voltage value. Thus, a target current can be accurately outputted even in the event of disturbances in drain potential.

In this case, the differential output can be outputted accurately without being modulated or distorted depending on the level of the common-mode output.

Also, the output when a specific numeric input is given can be stabilized.

In the foregoing, other configurations of the driver 1 including a differential drive circuit according to the first embodiment have been described.

Next, other configurations of the driver 1A including a differential drive circuit according to the second embodiment will be described as eleventh to sixteenth embodiments with reference to FIGS. 12 to 19.

Eleventh Embodiment

Figure 12:
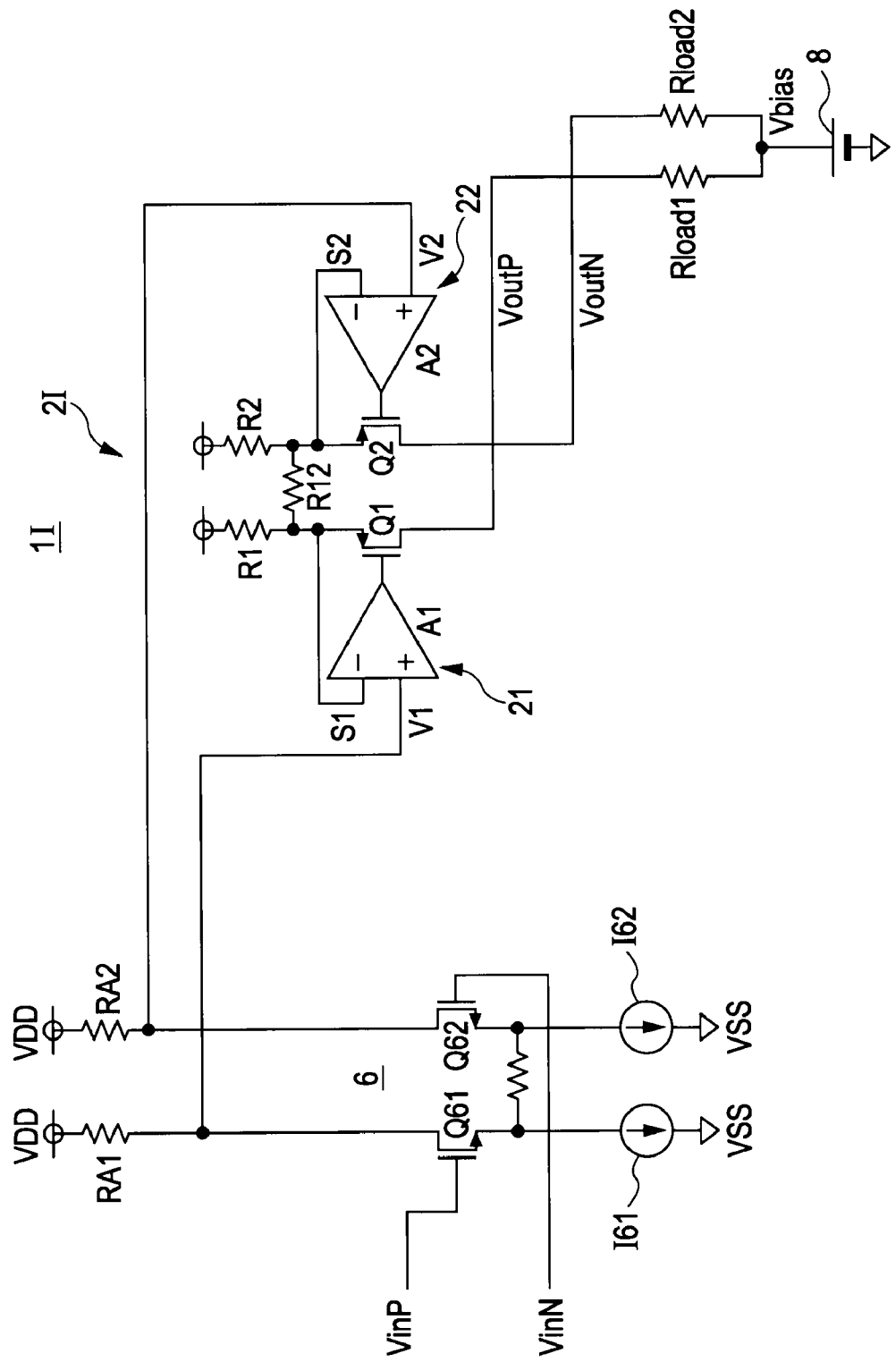
FIG. 12 is a circuit diagram showing a configuration of a driver including a differential drive circuit according to an eleventh embodiment of the present invention.

FIG. 12 is a circuit diagram showing a configuration of a driver including a differential drive circuit according to an eleventh embodiment of the present invention.

A driver 1I according to the eleventh embodiment differs from the driver 1A according to the second embodiment in that the drive of a load is performed by using only a pull-up circuit as the first drive system.

Specifically, the driver 1I in FIG. 12 uses, among the components of the driver 1A in FIG. 2, the PMOS transistors Q1 and Q2, the first and second circuits 21 and 22, the resistors R1 and R2, and the differential amplifier 6 to perform the drive of a load.

The drains of the PMOS transistors Q1 and Q2 are respectively connected to the load resistances Rload1 and Rload2, and the load resistances Rload1 and Rload2 are connected to the power supply 8 of a bias voltage Vbias.

According to the eleventh embodiment, there is provided negative feedback (NFB) that matches the source potential of each of the transistors Q1 and Q2 as output transistors with a drive target voltage value. Thus, a target current can be accurately outputted even in the event of disturbances in drain potential.

Twelfth Embodiment

Figure 13:
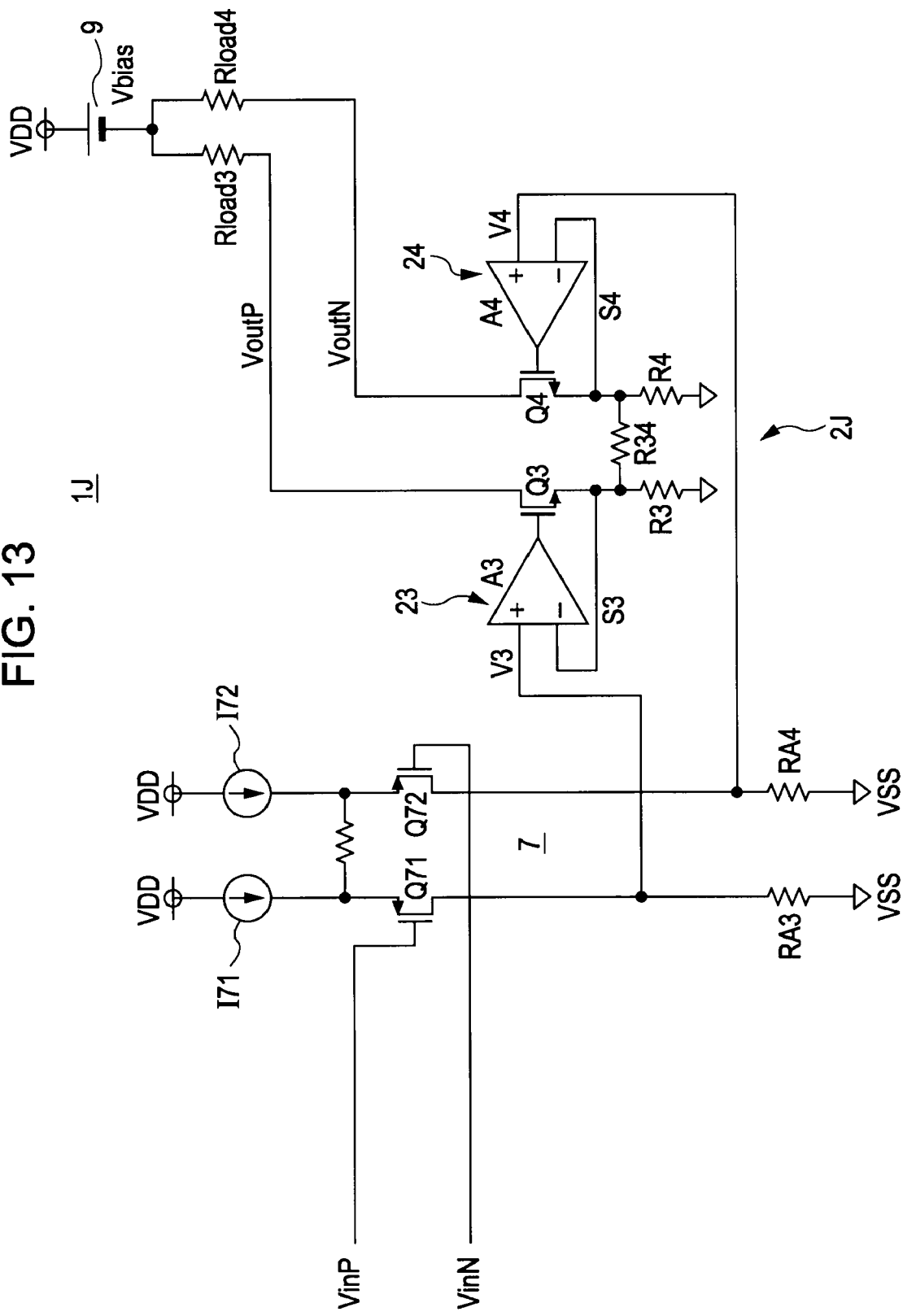
FIG. 13 is a circuit diagram showing a configuration of a driver including a differential drive circuit according to a twelfth embodiment of the present invention.

FIG. 13 is a circuit diagram showing a configuration of a driver including a differential drive circuit according to a twelfth embodiment of the present invention.

A driver 1J according to the twelfth embodiment differs from the driver 1A according to the second embodiment in that the drive of a load is performed by using only a pull-down circuit as the second drive system.

Specifically, the driver 1J in FIG. 13 uses, among the components of the driver 1A in FIG. 2, the NMOS transistors Q3 and Q4, the third and fourth circuits 23 and 24, the resistors R3 and R4, and the differential amplifier 7 to perform the drive of a load.

The drains of the NMOS transistors Q3 and Q4 are respectively connected to the load resistances Rload3 and Rload4, and the load resistances Rload3 and Rload4 are connected to the power supply 9 of a bias voltage Vbias.

According to the twelfth embodiment, there is provided negative feedback (NFB) that matches the source potential of each of the transistors Q3 and Q4 as output transistors with a drive target voltage value. Thus, a target current can be accurately outputted even in the event of disturbances in drain potential. At the same time, an intended common-mode voltage can be accurately outputted.

Thirteenth Embodiment

Figure 14:
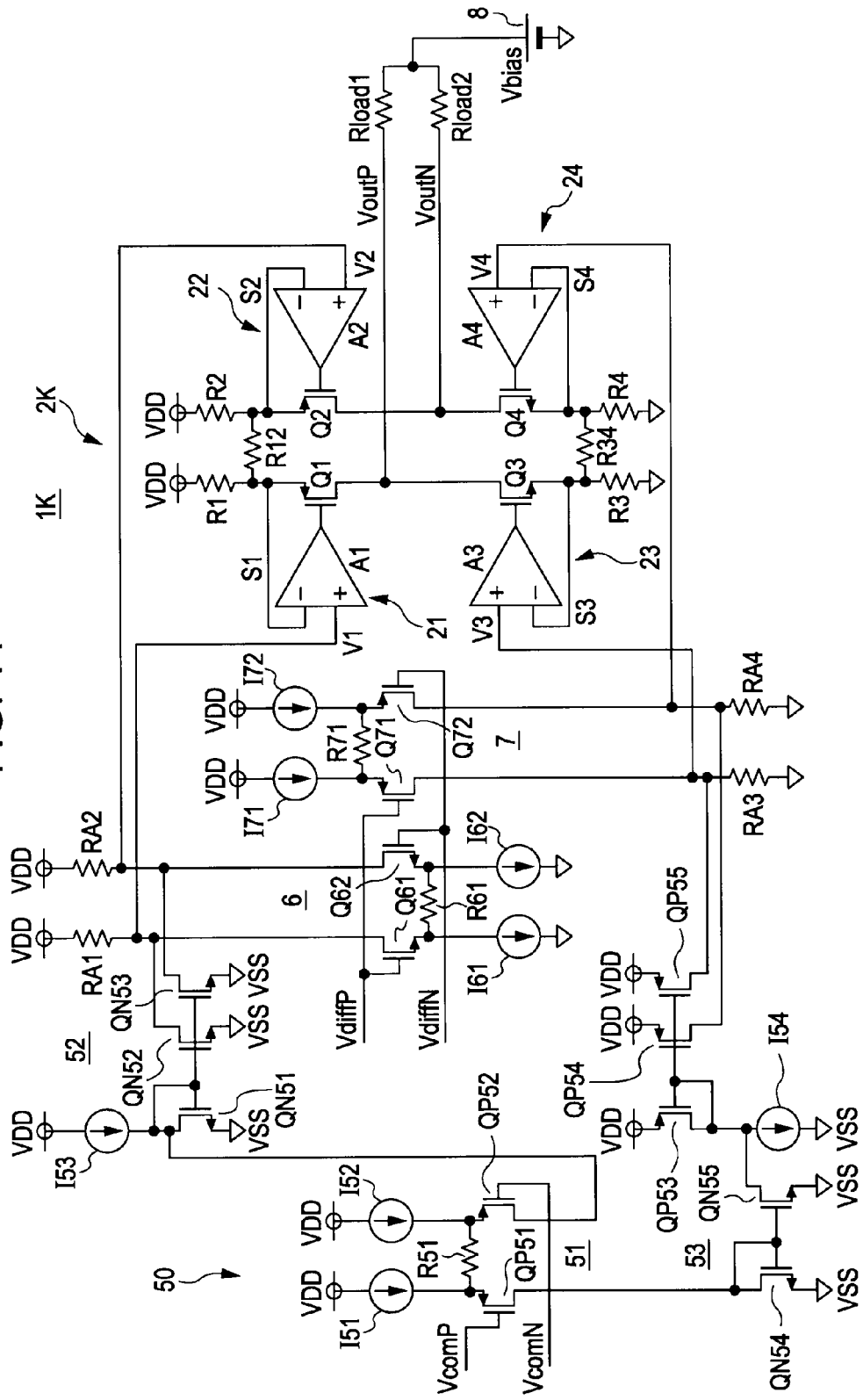
FIG. 14 is a circuit diagram showing a configuration of a driver including a differential drive circuit according to a thirteenth embodiment of the present invention.

FIG. 14 is a circuit diagram showing a configuration of a driver including a differential drive circuit according to a thirteenth embodiment of the present invention.

A driver 1K according to the thirteenth embodiment differs from the driver 1A according to the second embodiment in that the driver 1K has an offset adding circuit 50 that adds an offset to each of the drive target potentials V1 to V4.

The first and second output nodes NO1 and NO2 of a differential drive circuit 2K are respectively connected to the load resistances Rload1 and Rload2, and the load resistances Rload1 and Rload2 are connected to the power supply 8 of a bias voltage Vbias.

The offset adding circuit 50 has a differential amplifier 51, current mirror circuits 52 and 53, and a resistor R51.

The differential amplifier 51 has PMOS transistors QP51 and QP52, the resistor R51, and current sources I51 and I52.

The current mirror circuit 52 has NMOS transistors QN51 to QN53, and a current source I53.

The current mirror circuit 53 has NMOS transistors QN54 and QN55, PMOS transistors QP53 to QP55, and a current source I54.

The source of the PMOS transistor QP51 of the differential amplifier 51 is connected to the current source I51, and the drain is connected to the drain of the NMOS transistor QN54 of the current mirror circuit 52 and to the gates of the NMOS transistors QN54 and QN55.

The source of the PMOS transistor QP52 is connected to the current source I52, and the drain is connected to the drain of the NMOS transistor QN51 of the current mirror circuit 52.

The resistor R51 is connected between the source of the PMOS transistor QP51 and the source of the PMOS transistor QP52.

The gate of the PMOS transistor QP51 is connected to the supply line of a voltage VcomP. The gate of the PMOS transistor QP52 is connected to the supply line of a voltage VcomN.

In the current mirror circuit 52, the drain of the NMOS transistor QN51 is connected to the current source I53, the gate of the NMOS transistor QN51 itself, and the gates of the NMOS transistors QN52 and QN53, and the source is connected to the reference potential source VSS.

The source of the NMOS transistor QN52 is connected to the reference potential source VSS, and the drain is connected to the output part of the drive target potential V1 of the first differential amplifier 6, that is, to the junction between the resistor RA1 and the drain of the NMOS transistor Q61.

The source of the NMOS transistor QN53 is connected to the reference potential source VSS, and the drain is connected to the output part of the drive target potential V2 of the first differential amplifier 6, that is, to the junction between the resistor RA2 and the drain of the NMOS transistor Q62.

In the current mirror circuit 53, the sources of the NMOS transistors QN54 and QN55 are connected to the reference potential source VSS.

The drain of the NMOS transistor QN55 is connected to the drain of the PMOS transistor QP53 and the current source I54.

The source of the PMOS transistor QP53 is connected to the power supply potential source VDD, and the drain is connected to the gate of the PMOS transistor QP53 itself and to the gates of the PMOS transistors QP54 and QP55.

The source of the PMOS transistor QP54 is connected to the power supply potential source VDD, and the drain is connected to the output part of the drive target potential V4 of the second differential amplifier 7, that is, to the junction between the resistor RA4 and the drain of the PMOS transistor Q72.

The source of the PMOS transistor QP55 is connected to the power supply potential source VDD, and the drain is connected to the output part of the drive target potential V3 of the second differential amplifier 7, that is, to the junction between the resistor RA3 and the drain of the PMOS transistor Q71.

In the driver 1K, an offset is given to each of the drive target potentials V1 to V4 by the differential amplifier 51 that is an added differential pair.

As compared with when the voltages VcomP and VcomN given to the differential amplifier 51 are balanced, when a signal given as [VcomP−VcomN] is positive, currents flowing to the first and second differential amplifiers 6 and 7 change.

That is, when the signal given as [VcomP−VcomN] is positive, currents flowing through the resistors RA1 and RA2 of the first differential amplifier 6 increase, and currents flowing through the resistors RA3 and RA4 of the second differential amplifier 7 decrease.

As a result, the drive target potential V1 and the drive target potential V2 drop, and the currents flowing through the resistors R1 and R2 of the differential drive circuit 2K increase. Since the drive target potential V3 and the drive target potential V4 drop, the currents flowing through the resistors R3 and R4 decrease.

That is, pull-up currents outputted from the first and second transistor Q1 and Q2 increase, and pull-down currents outputted from the third and fourth transistor Q3 and Q4 decrease, so the common-mode voltage of the outputs VoutP and VoutN rises.

However, since the increases in output of the first and second transistors Q1 and Q2 are the same, and the decreases in output of the third and fourth transistors Q3 and Q4 are also the same, there is no change in differential voltage.

That is, this circuit is also capable of an accurate differential output that is independent of the level of the common-mode voltage.

According to the thirteenth embodiment, there is provided negative feedback (NFB) that matches the source potential of each of the transistors Q1 to Q4 as output transistors with a drive target voltage value. Thus, a target current can be accurately outputted even in the event of disturbances in drain potential.

A differential signal with desired common-mode component can be outputted even when the gate voltage-drain current characteristic of MOS transistors (field effect transistor) is not linear or differs between PMOS and NMOS.

Also, in the thirteenth embodiment, due to the good linearity between a drive target voltage given as an input and an output voltage, a waveform that is strictly regulated for restricting the bandwidth can be correctly sent to the load.

Further, the thirteenth embodiment also has an advantage in that the ratio of the load driving current to the consumption current at the output stage can be set large, thus providing excellent power efficiency.

Also, a current that is proportional to a target drive voltage can be outputted accurately independently of the condition of the load.

Also, the differential output can be outputted accurately without being modulated or distorted depending on the level of the common-mode output.

Fourteenth Embodiment

Figure 15:
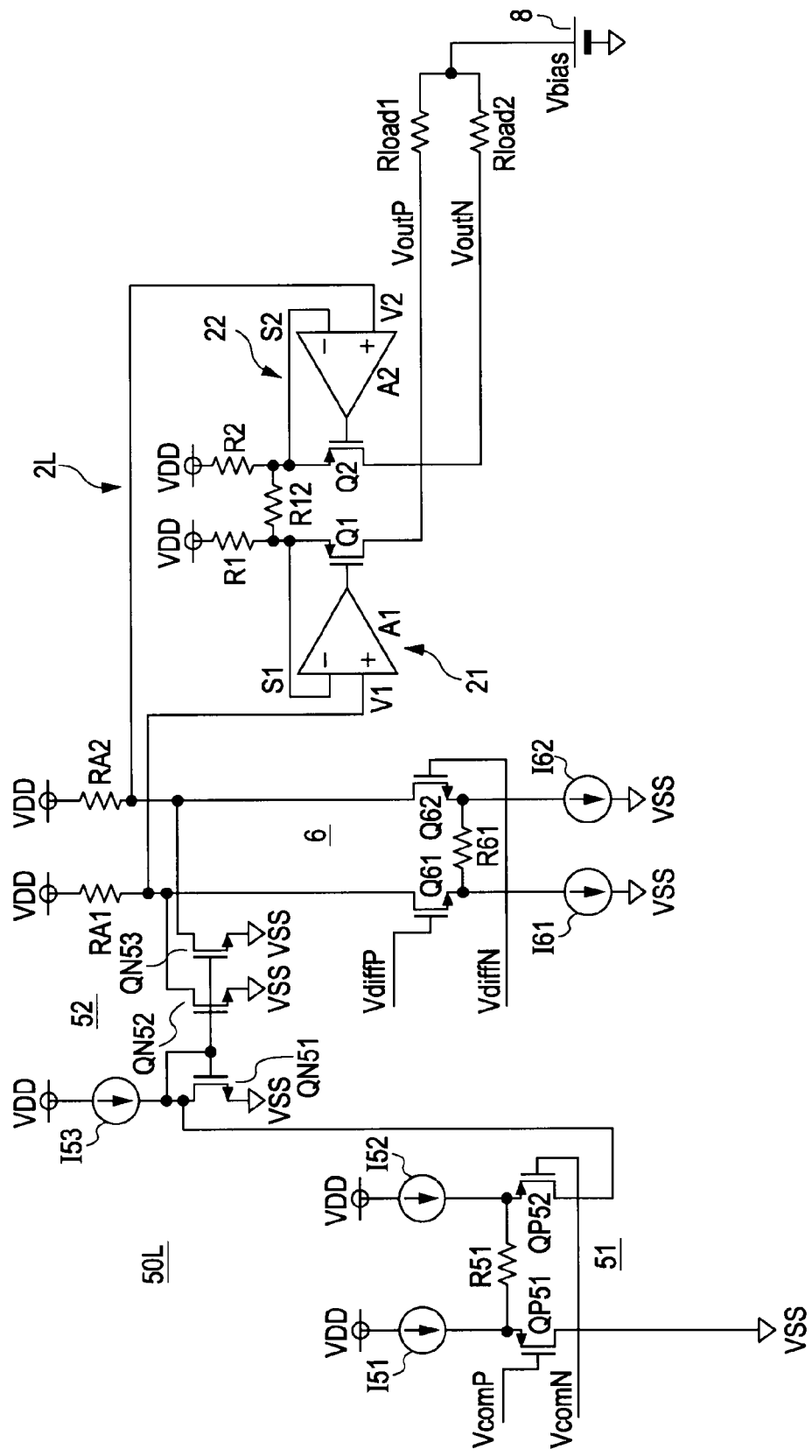
FIG. 15 is a circuit diagram showing a configuration of a driver including a differential drive circuit according to a fourteenth embodiment of the present invention.

FIG. 15 is a circuit diagram showing a configuration of a driver including a differential drive circuit according to a fourteenth embodiment of the present invention.

A driver 1L according to the fourteenth embodiment differs from the driver 1K according to the thirteenth embodiment in that the drive of a load is performed by using only a pull-up circuit as the first drive system.

Specifically, the driver 1L in FIG. 15 uses, among the components of the driver 1K in FIG. 14, the PMOS transistors Q1 and Q2, the first and second circuits 21 and 22, the resistors R1 and R2, the differential amplifier 6, the differential amplifier 51, and the current mirror circuit 52 to perform the drive of a load.

The drains of the PMOS transistors Q1 and Q2 are respectively connected to the load resistances Rload1 and Rload2, and the load resistances Rload1 and Rload2 are connected to the power supply 8 of a bias voltage Vbias.

It should be noted, however, that the drain of the PMOS transistor QP51 of the differential amplifier 51 is connected to the reference potential source VSS.

According to the fourteenth embodiment, there is provided negative feedback (NFB) that matches the source potential of each of the transistors Q1 and Q2 as output transistors with a drive target voltage value. Thus, a target current can be accurately outputted even in the event of disturbances in drain potential.

Also, the differential output can be outputted accurately without being modulated or distorted depending on the level of the common-mode output.

Fifteenth Embodiment

Figure 16:
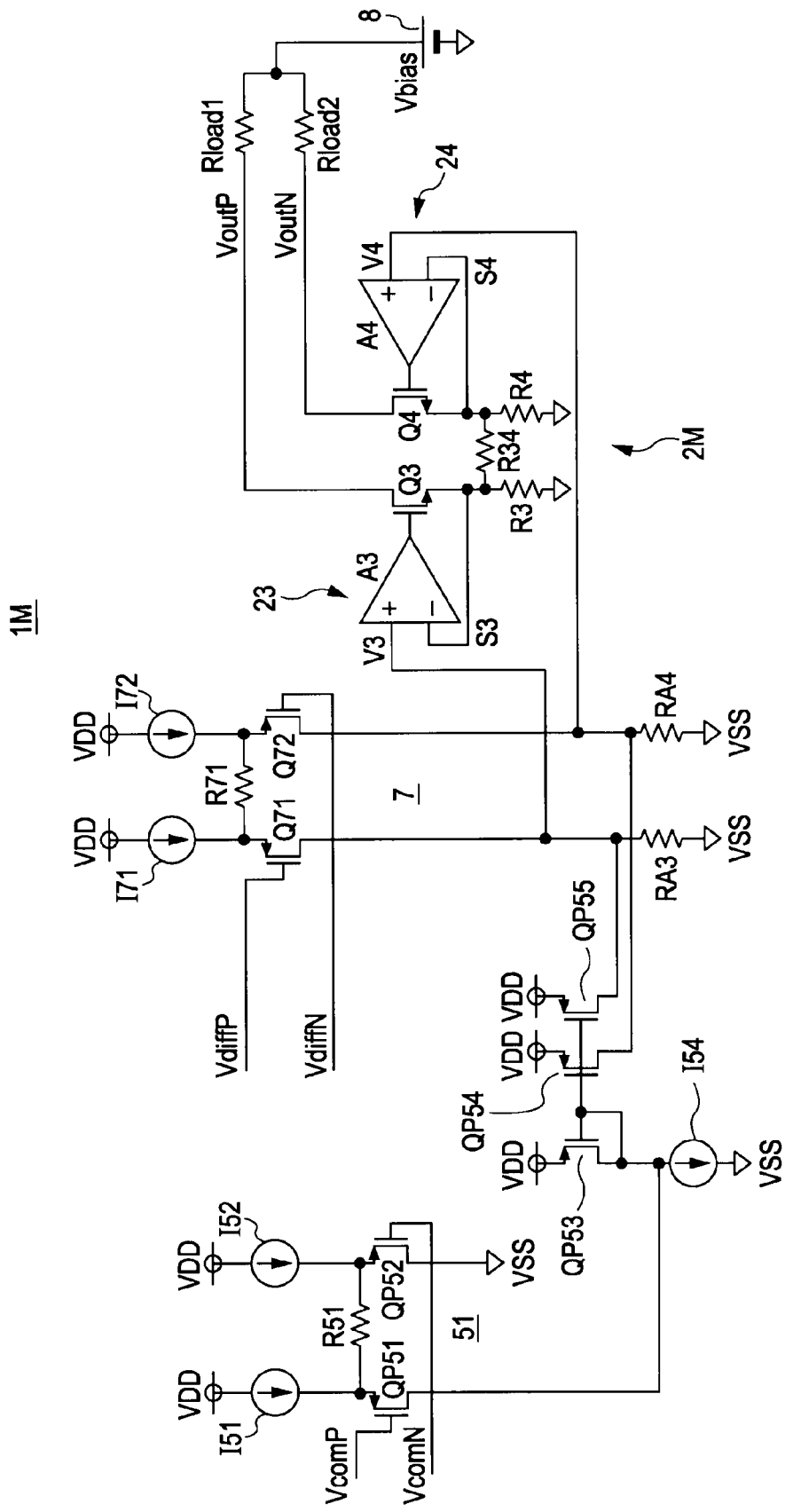
FIG. 16 is a circuit diagram showing a configuration of a driver including a differential drive circuit according to a fifteenth embodiment of the present invention.

FIG. 16 is a circuit diagram showing a configuration of a driver including a differential drive circuit according to a fifteenth embodiment of the present invention.

A driver 1M according to the fifteenth embodiment differs from the driver 1K according to the thirteenth embodiment in that the drive of a load is performed by using only a pull-down circuit as the second drive system.

Specifically, the driver 1M in FIG. 16 uses, among the components of the driver 1K in FIG. 14, the NMOS transistors Q3 and Q4, the third and fourth circuits 23 and 24, the resistors R3 and R4, the differential amplifier 7, the differential amplifier 51, and the current mirror circuit 53 to perform the drive of a load.

The drains of the NMOS transistors Q3 and Q4 are respectively connected to the load resistances Rload1 and Rload2, and the load resistances Rload1 and Rload2 are connected to the power supply 8 of a bias voltage Vbias.

It should be noted, however, that the drain of the PMOS transistor QP52 of the differential amplifier 51 is connected to the reference potential source VSS.

Also, in the current mirror circuit 53, the NMOS transistors QN54 and QN55 in FIG. 14 are not used, and the drain of the PMOS transistor QP51 of the differential amplifier 51 is connected to the current source I54 and the drain of the PMOS transistor QP53.

According to the fifteenth embodiment, there is provided negative feedback (NFB) that matches the source potential of each of the transistors Q1 and Q2 as output transistors with a drive target voltage value. Thus, a target current can be accurately outputted even in the event of disturbances in drain potential.

Also, the differential output can be outputted accurately without being modulated or distorted depending on the level of the common-mode output.

Sixteenth Embodiment

Figure 17:
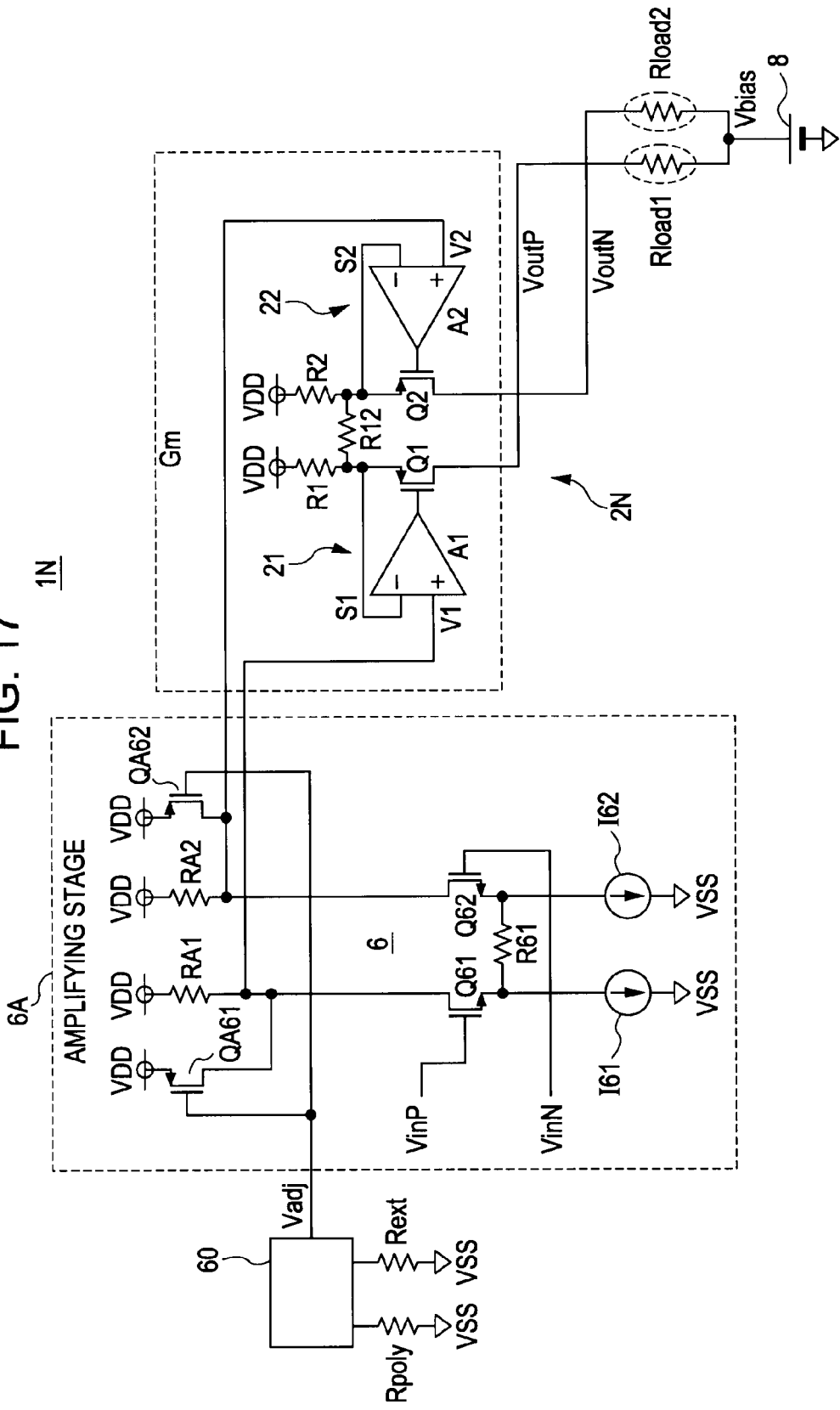
FIG. 17 is a circuit diagram showing a configuration of a driver including a differential drive circuit according to a sixteenth embodiment of the present invention.

FIG. 17 is a circuit diagram showing a configuration of a driver including a differential drive circuit according to a sixteenth embodiment of the present invention.

A driver 1N according to the sixteenth embodiment has the following components added to the configuration of the driver 1I according to the twelfth embodiment.

That is, the driver 1N has PMOS transistors QA61 and QA62 for resistance adjustment that are connected in parallel with the load resistances RA1 and RA2 of the differential amplifier 6 at the first stage. A gate potential Vadj of each of the PMOS transistors QA61 and QA62 is controlled by a gain adjusting circuit 60.

The driver 1N has at the output stage a transconductance circuit that outputs a current that is proportional to the drive target potentials V1 and V2 and is inversely proportional to the resistances R1 and R2.

A total gain Gtot from a differential input [VinP−VinN] to the differential amplifier 6 at the first stage, to a differential output [VoutP−VoutN] of the differential drive circuit 2N is represented by the following equation, supposing that the gain of the differential amplifier 6 at the first stage is Gamp.

[Eq. 15]

$$Gtot = Gamp \cdot (1/R) \cdot Rload$$

Here, R denotes a combined resistance value determined by resistors R1, R2, and R12 of the differential drive circuit 2N. Since each resistor R is placed inside the integrated circuit, if the load resistance Rload is placed outside the integrated circuit, the ratio between R and Rload is not constant. The gain of the differential amplifier 6 also varies in accordance with the device characteristics or temperature of the integrated circuit.

Therefore, the total gain is also subject to large manufacturing variability and temperature drift of the integrated circuit.

Accordingly, the circuit shown in FIG. 17 adopts the above-described configuration to keep the total gain Gtot constant.

That is, in the circuit in FIG. 17, the PMOS transistors QA61 and QA62 for resistance adjustment are connected in parallel with the load resistances RA1 and RA2 of the differential amplifier 6 at the first stage, forming an amplifying stage (level shifter) 6A.

The circuit in FIG. 17 is configured such that the gate potential Vadj thereof is controlled by the gain adjusting circuit 60.

Figure 18:
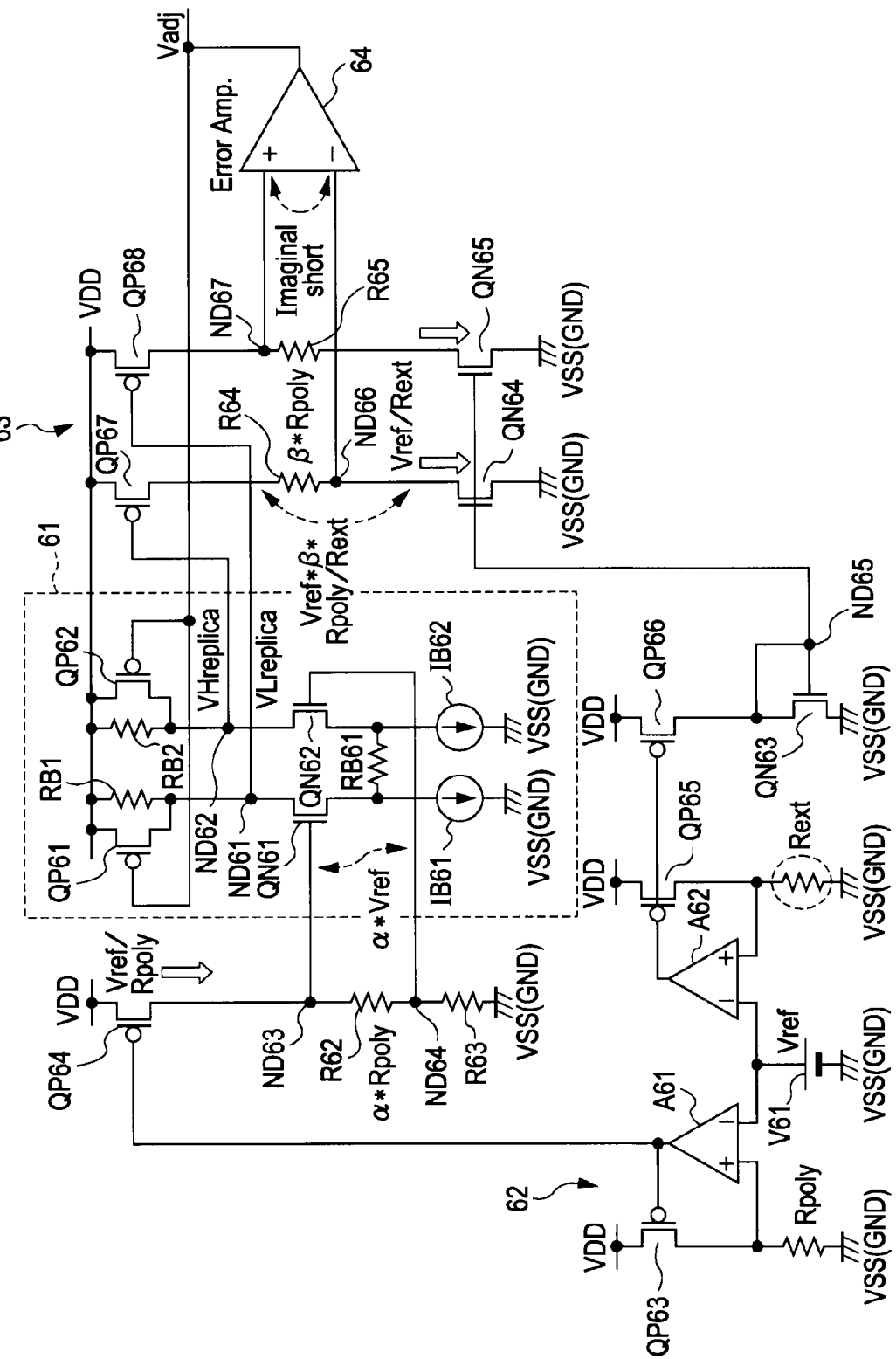
FIG. 18 is a circuit diagram showing a first configuration of a gain adjusting circuit in FIG. 17.

FIG. 18 is a circuit diagram showing a first configuration of the gain adjusting circuit 60 shown in FIG. 17.

A gain adjusting circuit 60A in FIG. 18 has a replica circuit 61 at the amplifying stage 6A, and a reference voltage and offset voltage supplying section (hereinafter, referred to as a voltage supplying section) 62.

The gain adjusting circuit 60A further has an offset adding circuit 63 that adds an offset to the output of the replica circuit 61, and a feedback amp (error amp) 64 that balances the replica output with an offset.

The replica circuit 61 has the same configuration as that of the amplifying stage 6A.

That is, the replica circuit 61 has NMOS transistors QN61 and QN62, resistors RB1, RB2, and RB61, current sources IB61 and IB62, and PMOS transistors QP61 and QP62.

In the replica circuit 61, the source of the NMOS transistor QN61 is connected to the current source IB61, the drain is connected to one end of the resistor RB1 and the drain of the PMOS transistor QP61, and a node ND61 is formed by the junction thereof. The other end of the resistor RB1 and the source of the PMOS transistor QP61 are connected to the power supply potential source VDD.

The source of the NMOS transistor QN62 is connected to the current source IB62, the drain is connected to one end of the resistor RB2 and the drain of the PMOS transistor QP62, and a node ND62 is formed by the junction thereof. The other end of the resistor RB2 and the source of the PMOS transistor QP62 are connected to the power supply potential source VDD.

The resistor RB61 is connected between the drain of the NMOS transistor QN61 and the drain of the NMOS transistor QN62.

The gates of the NMOS transistors QN61 and QN62 are connected to a reference voltage supplying section of the voltage supplying section 62.

The output of the error amp 64 is feedback supplied to the gates of the PMOS transistors QP61 and QP62.

The output of the error amp 64 is given as the gate potential Vadj of each of the PMOS transistors QA61 and QA62 at the amplifying stage 6A.

The voltage supplying section 62 has a reference voltage source V61, a monitor resistor Rpoly, a referenced resistor Rext, and operational amplifiers A61 and A62.

The voltage supplying section 62 has PMOS transistors QP63 to QP66, an NMOS transistor QN63, and resistors R62 and R63 on the reference voltage output side.

One end of the monitor resistor Rpoly is connected to the non-inverting input terminal (+) of the operational amplifier A61 and to the drain of the PMOS transistor QP63, and the other end is connected to the reference potential source VSS (for example, the ground potential GND).

The source of the PMOS transistor QP63 is connected to the power supply potential source VDD, and the gate is connected to the output of the operational amplifier A61.

The source of the PMOS transistor QP64 is connected to the power supply potential source VDD, the drain is connected to one end of the resistor R62, and a connecting node ND63 thereof is connected to the gate of the NMOS transistor QN61 of the replica circuit 61.

One end of the resistor R62 is connected to one end of the resistor R63, and a connecting node ND64 thereof is connected to the gate of the NMOS transistor QN62 of the replica circuit 61. The other end of the resistor R63 is connected to the reference potential source VSS.

The respective inverting input terminals (−) of the operational amplifiers A61 and A62 are commonly connected to the reference voltage source V61.

One end of the referenced resistor Rext is connected to the non-inverting input terminal (+) of the operational amplifier A62 and to the drain of the PMOS transistor QP65. The sources of the PMOS transistors QP65 and QP66 are connected to the power supply potential source VDD, and the respective gates thereof are connected to the output of the operational amplifier A62.

The drain of the PMOS transistor QP66 is connected to the drain and gate of the NMOS transistor QN63, and a connecting node ND65 thereof is connected to the input section of the offset adding circuit 63.

The offset voltage adding section 63 has PMOS transistors QP67 and QP68, NMOS transistors QN64 and QN65, and resistors R64 and R65.

In the offset adding circuit 63, the source of the PMOS transistor QP67 is connected to the power supply potential source VDD, the drain is connected to one end of the resistor R64, and the gate is connected to the node ND62 on the high output side (VH) of the replica circuit 61.

The other end of the resistor R64 is connected to the drain of the NMOS transistor QN64, and a connecting node ND66 thereof is connected to the inverting input terminal (−) of the error amp 64. The source of the NMOS transistor QN64 is connected to the reference potential source VSS.

The source of the PMOS transistor QP68 is connected to the power supply potential source VDD, the drain is connected to one end of the resistor R65, and a connecting node ND67 thereof is connected to the non-inverting input terminal (+) of the error amp 64.

The gate of the PMOS transistor QP68 is connected to the node ND61 on the low output side (VL) of the replica circuit 61.

The other end of the resistor R65 is connected to the drain of the NMOS transistor QN65, and the source of the NMOS transistor QN64 is connected to the reference potential source VSS.

The gates of the NMOS transistors QN64 and QN65 are commonly connected to the node ND65 on the offset voltage output side of the voltage supplying section 62.

Here, the referenced resistor Rext is a resistance that is outside the integrated circuit and maintains its ratio to the load resistance with high accuracy. The monitor resistor Rpoly is a resistance inside the integrated circuit and maintains an accurate ratio to R at all times.

In the circuit in FIG. 18, a state in which the reference potential Vref is applied to the monitor resistor Rpoly is realized by negative feedback (NFB).

A current flowing through the monitor resistor Rpoly in that state flows through the bias resistor R62 at the input of the differential pair of the replica circuit due to a current mirror including the PMOS transistor QP64. As a result, the differential input of a differential amplifier formed by the NMOS transistors QN61 and QN62 of the replica circuit 61 becomes α·Vref.

Here, α is a ratio between the monitor resistor Rpoly and the bias resistor R62. If these resistors are fabricated into the same integrated circuit, α becomes a substantially constant value at all times.

The referenced resistor Rext is also in a state applied with the reference voltage Vref, and the same current as that flowing through the referenced resistor Rext is also passed to the output offset resistors R64 and R65.

By also fabricating the output offset resistors R64 and R65 into the same integrated circuit with the monitor resistor Rpoly, the ratio β therebetween can be also made substantially constant.

With this configuration, the output offset voltage is proportional to the reference voltage Vref multiplied by the ratio between the monitor resistor Rpoly and the referenced resistor Rext.

The output of the differential amplifier of the replication circuit 61 to which an offset is given is inputted to the error amp 64, and NFB is applied so that the inputs of the error amp 64 are balanced by operating the gates of the load-adjusting PMOS transistors QP61 and QP62 of the differential amplifier.

If this balance is established, this means that the gain Gamp of the differential amplifier is adjusted as follows.

[Eq. 16]

$$Gamp = (Vref * \beta * Rpoly/Rext)/(\alpha * Vref) = (1/\alpha) * \beta * Rpoly/Rext$$

Since R is also a combined resistance of integrated circuit resistances, R maintains a constant ratio to the monitor resistor Rpoly.

Rewriting the equation for total gain supposing that R=Rpoly/γ gives the following equation.

$$Gtot = (1/\alpha) * \beta * \gamma * Rload/Rext$$

Since α, β, and γ are each a resistance ratio within the same integrated circuit as described above, and hence has a substantially constant value that is affected by neither manufacturing variability nor temperature.

The ratio Rload/Rext is also constant provided that Rload and Rext are resistances outside the integrated circuit and with accurate absolute values and small temperature characteristics.

Therefore, this equation indicates that the circuit according to the sixteenth embodiment gives a stable total gain that is affected by neither manufacturing variability nor temperature.

By switching the polarity of this gain adjusting circuit, it is possible to perform the gain adjustment of the pull-down drive circuit shown in FIG. 13.

As for the push-pull drive circuit according to the second embodiment, adjustment is possible by using both of the circuit shown in FIG. 17 and the reversed polarity circuit thereof.

Figure 19:
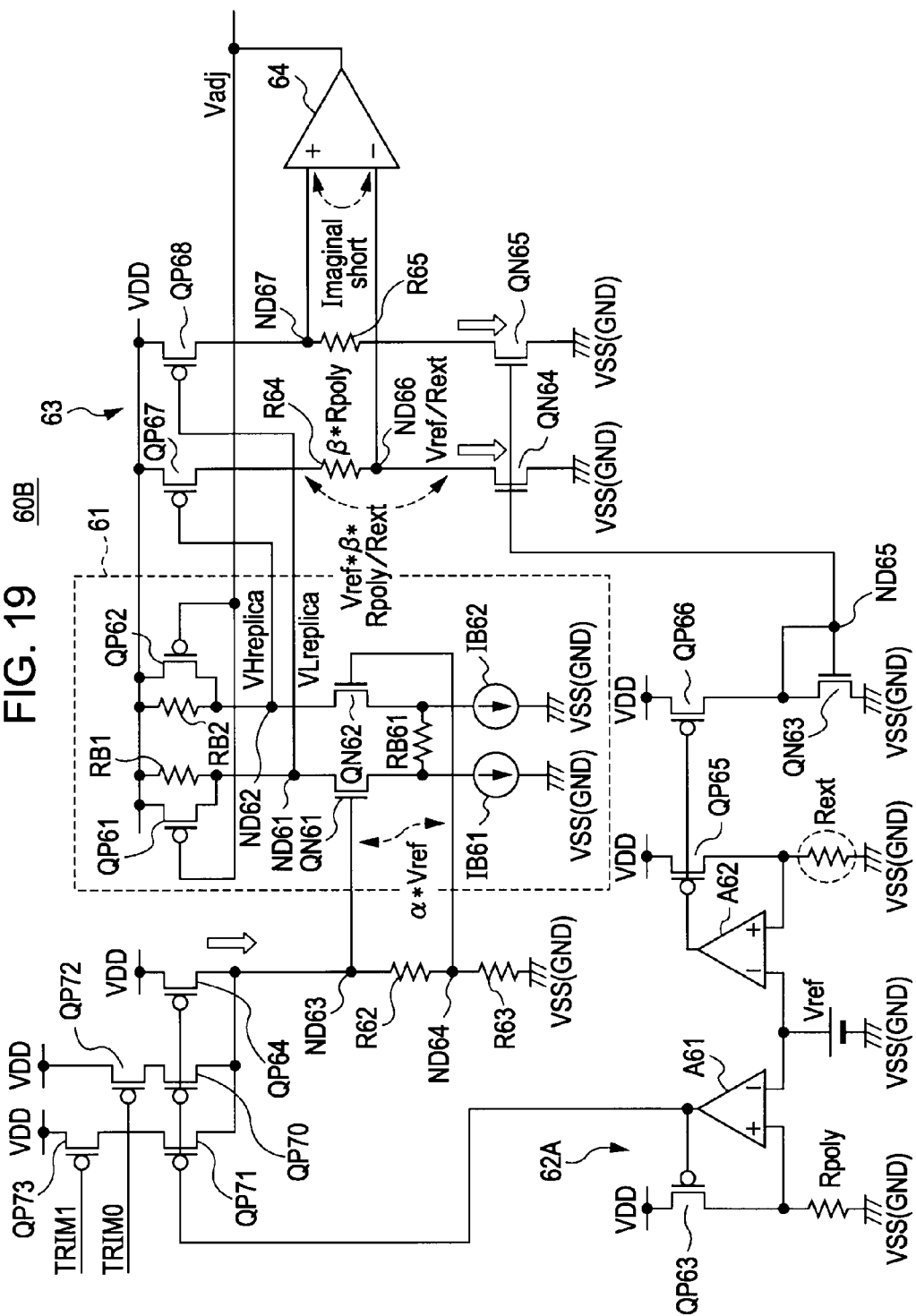
FIG. 19 is a circuit diagram showing a second configuration of the gain adjusting circuit in FIG. 17.

FIG. 19 is a circuit diagram showing a second configuration of the gain adjusting circuit 60 shown in FIG. 17.

A gain adjusting circuit 60B in FIG. 19 differs from the gain adjusting circuit 60A in FIG. 18 as follows.

That is, the current ratio in a current mirror circuit that causes current having flown through the monitor resistor Rpoly to flow to the input bias resistor R62 of the operational amplifier of the replica circuit 61 is changed slightly by a control signal TRIM.

Specifically, in a voltage supplying section 62A, PMOS transistors QP70 to QP73 are connected in parallel with the PMOS transistor QP64 forming the current mirror circuit.

The drain of the PMOS transistor QP70 is connected to the node ND63, the source is connected to the drain of the PMOS transistor QP72, and the source of the PMOS transistor QP72 is connected to the power supply potential source VDD.

The drain of the PMOS transistor QP71 is connected to the node ND63, the source is connected to the drain of the PMOS transistor QP73, and the source of the PMOS transistor QP73 is connected to the power supply potential source VDD.

The gates of the PMOS transistors QP70 and QP71 are connected to the output of the operational amplifier A61, commonly with the gate of the PMOS transistor QP64.

The gate of the PMOS transistor QP72 is connected to the supply line of a control signal TRIM1, and the gate of the PMOS transistor QP73 is connected to the supply line of a control signal TRIM2.

In the voltage supplying section 62A, the ratio of current passed to the input bias resistor R62 by the current mirror circuit is changed slightly by opening/closing the PMOS transistors QP72 and QP73 by the control signals TRIM1 and TRIM0.

This is equivalent to adjusting the ratio α between the monitor resistor Rpoly and the bias resistor R62. As a result, the total gain can be also adjusted.

Even through the resistance ratios α, β, and γ within an integrated circuit are substantially constant, there are slight errors due to manufacturing variability. If a large number of integrated circuits are manufactured, in rare instances, there may be one with a large error.

In the gain adjusting circuit 60B in FIG. 19, the total gain caused by a resistance ratio error due to manufacturing variability can be corrected by the control signals TRIM1 and TRIM0.

Reversing the polarity of the circuit in FIG. 19, and combined use with the reversed polarity circuit enable application to the circuit shown in FIG. 13 according to the fourteenth embodiment and the circuit according to the second embodiment.

In the foregoing, a description has been given of another configuration of the driver 1A including a differential drive circuit according to the second embodiment.

Next, another configuration of the communication device 100 according to the third embodiment will be described as seventeenth to twentieth embodiments with reference to FIGS. 20 to 23.

Seventeenth Embodiment

Figure 20:
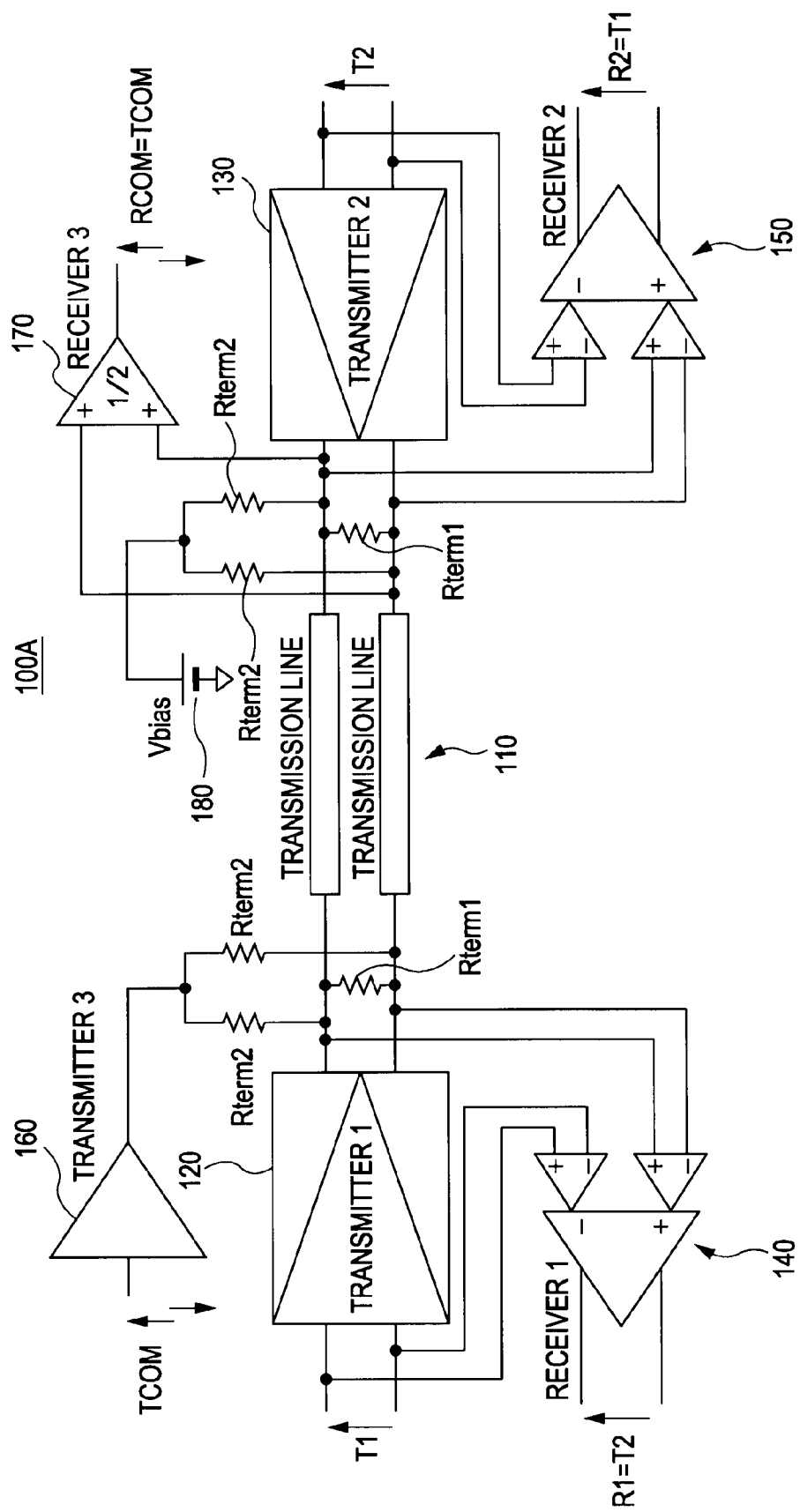
FIG. 20 is a diagram showing a configuration of a communication device according to a seventeenth embodiment of the present invention.

FIG. 20 is a diagram showing a configuration of a communication device according to a seventeenth embodiment of the present invention.

A communication device 100A according to the seventeenth embodiment has, in addition to the configuration of the communication device 100 according to the third embodiment, a transmitter 160 arranged on the transmitter 120 side, and a receiver 170 and a bias power supply 180 arranged on the transmitter 130 side.

One end side of the differential transmission line 110 is terminated by a single terminating resistor Rterm1 near the transmitter 120, and the output of the transmitter 160 is connected to the differential transmission line 110 via two terminating resistors Rterm2.

The other end side of the differential transmission line 110 is terminated by a single terminating resistor Rterm1 near the transmitter 130, and the output of the transmitter 160 is connected to the DC bias power supply 180 via two terminating resistors Rterm2.

The receiver 170 is connected to the other end side of the differential transmission line 110.

The transmitters 120 and 130 include the above-described differential drive circuit 2 or 2A according to the first or second embodiment, for example.

The differential drive circuit (output circuit) according to this embodiment outputs an accurate differential current at all times irrespective of the potential of the output. Therefore, even when another signal at a common-mode potential is superimposed on the differential signal pair, there are no disturbances in the differential signal, and there is little leakage to the common-mode signal accompanying differential signal drive which causes noise for the common-mode signal.

As described above, in the communication device 100A according to the seventeenth embodiment, the differential transmission line 110 is terminated in parallel by a single resistor Rterm1 and two serial resistors Rterm2(−1, −2). The node of each transistor Rterm2 is applied with a low impedance signal voltage on the transmitter 120 side, and is biased with a DC voltage on the transmitter 130 side.

As for the impedance when the transmitter is seen from the differential transmission line 110 side, the parallel resistances of the terminating resistors Rterm1 and Rterm2, and two parallel resistors of the terminating resistor Rterm1 and the terminating resistor Rterm2 in differential mode, and two parallel resistors Rterm2 are seen in differential mode and common mode, respectively.

For example, supposing that the terminating resistor Rterm1 is 1 kΩ, and the terminating resistor Rterm2 is 56Ω, this means that the differential transmission line 110 is terminated with approximately 100Ω in differential mode, and with 28Ω in common mode, thus realizing impedance matching to 100Ω in the differential mode and 30Ω in the common mode, which are typical for a paired transmission line with electromagnetic coupling.

When a common-mode voltage signal is sent to such a transmission line from the transmitter 160, the receiver 170 can receive a signal as the average voltage of a differential pair.

This transmission is realized without interference with differential signal transmission from the transmitter 120 to the receiver 150 and differential signal transmission from the transmitter 130 to the receiver 140.

Eighteenth Embodiment

Figure 21:
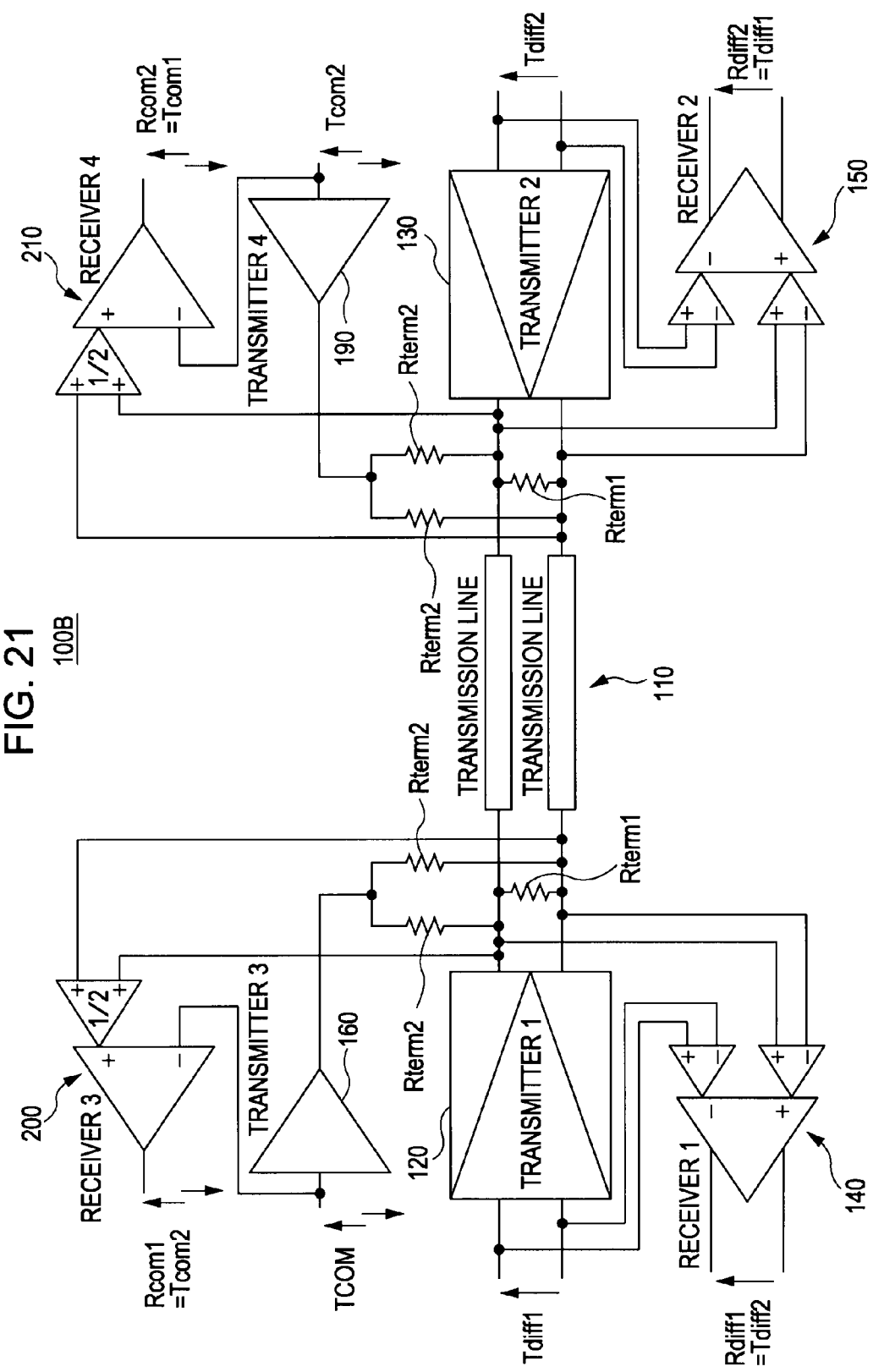
FIG. 21 is a diagram showing a configuration of a communication device according to an eighteenth embodiment of the present invention.

FIG. 21 is a diagram showing a configuration of a communication device according to an eighteenth embodiment of the present invention.

In a communication device 100B according to the eighteenth embodiment, a receiver 200 is arranged in parallel with the transmitter 160 on one end side of the differential transmission line 110, and a transmitter 190 and a transmitter 210 are likewise connected in parallel on the other end side.

In the communication device 100B, common-mode signal transmission is also realized without the two-way communications from the transmitter 160 to the receiver 210 and from the transmitter 190 to the receiver 200 coming into interference with each other in a simultaneous, parallel manner.

Nineteenth Embodiment

Figure 22:
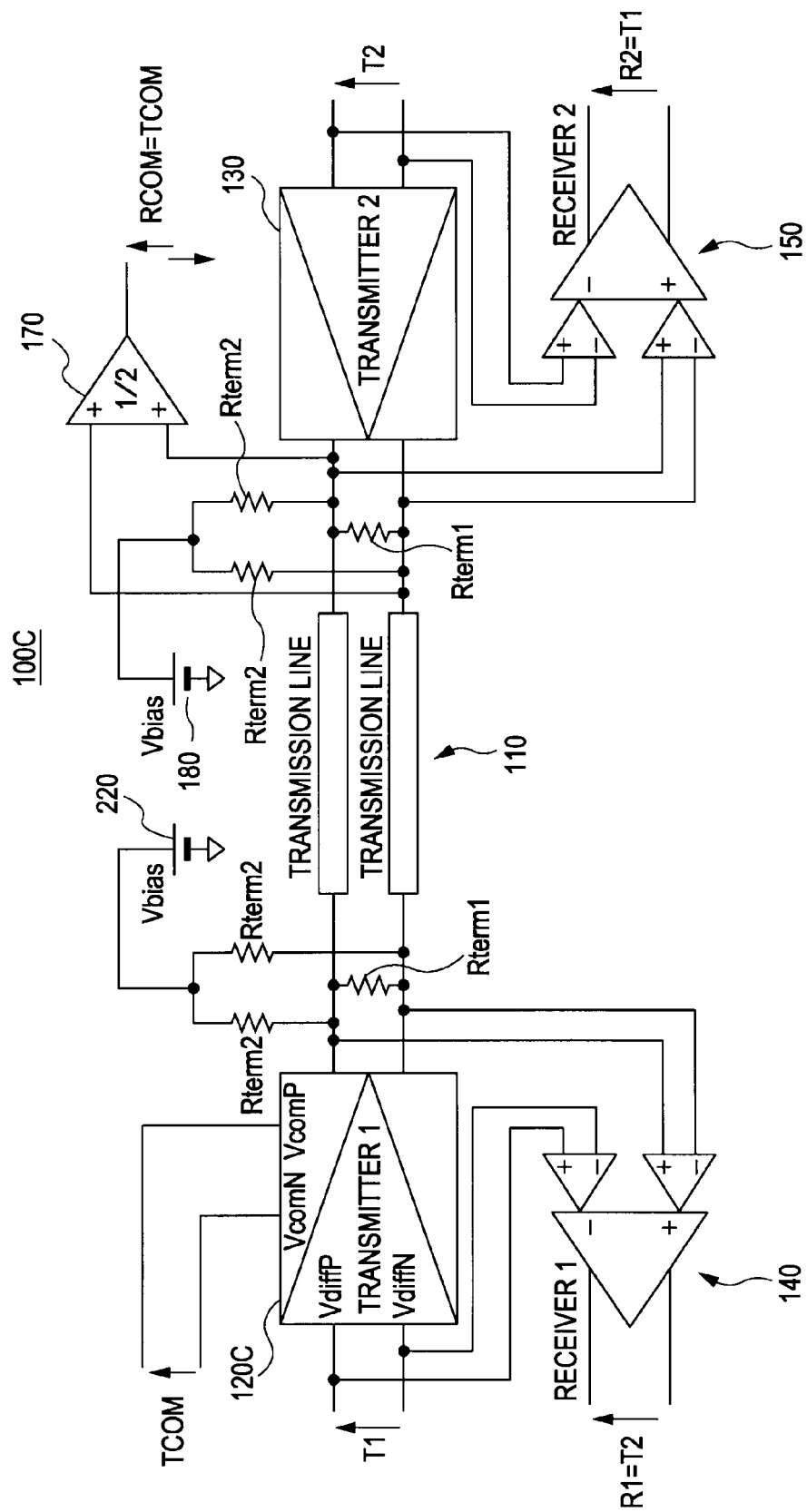
FIG. 22 is a diagram showing a configuration of a communication device according to a nineteenth embodiment of the present invention.

FIG. 22 is a diagram showing a configuration of a communication device according to a nineteenth embodiment of the present invention.

A communication device 100C according to the nineteenth embodiment differs from the communication device 100A according to the eighteenth embodiment in that the driver 1D according to the sixth embodiment or the driver 1K according to the thirteenth embodiment is applied to a transmitter 120C on one end side of the differential transmission line 110.

Also, the communication device 100C has a bias power supply 220 instead of the transmitter 160, and one end side of the differential transmission line 110 is biased with a DC voltage through the resistors Rterm2.

Twentieth Embodiment

Figure 23:
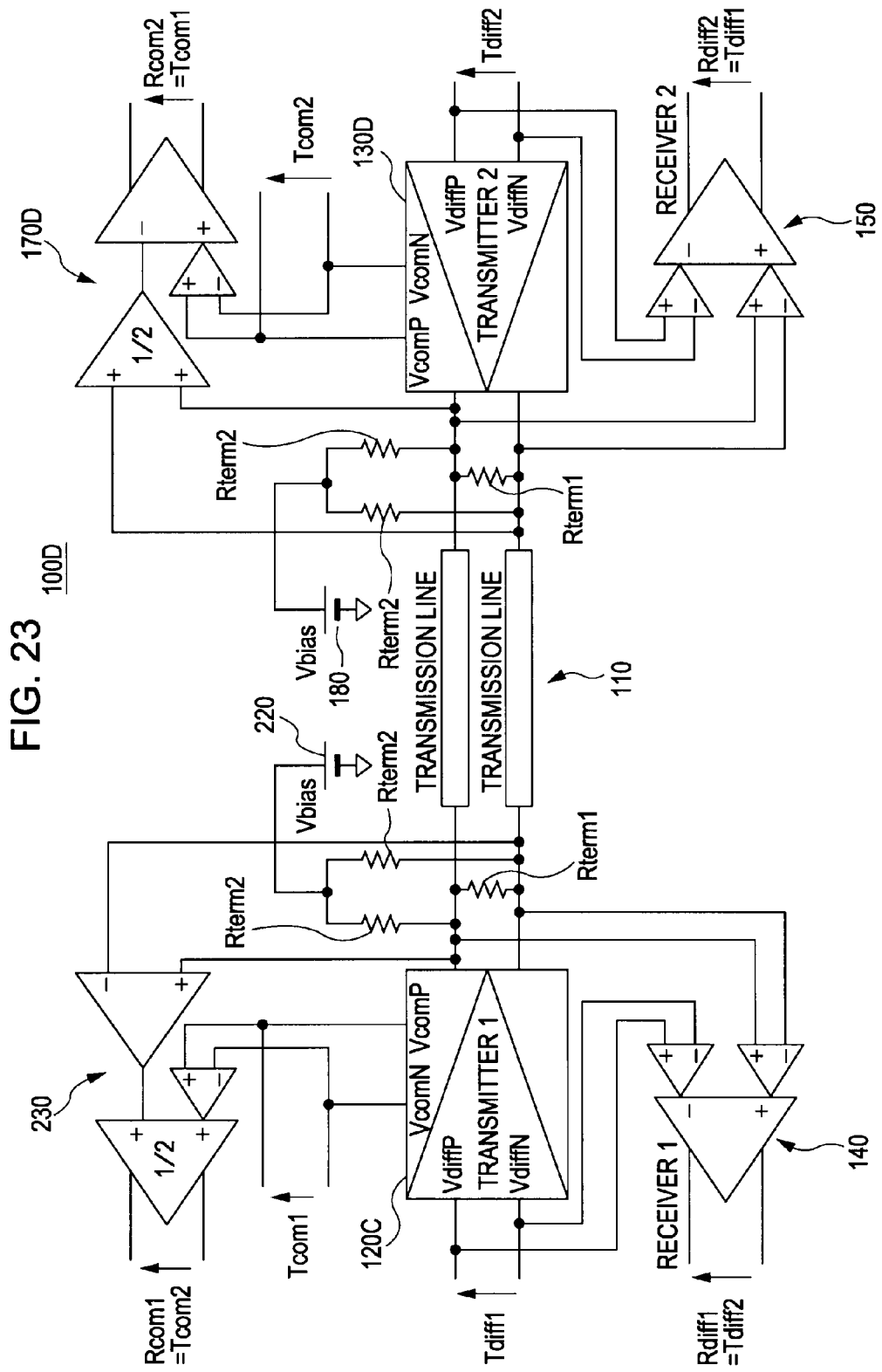
FIG. 23 is a diagram showing a configuration of a communication device according to a twentieth embodiment of the present invention.

FIG. 23 is a diagram showing a configuration of a communication device according to a twentieth embodiment of the present invention.

A communication device 100D according to the twentieth embodiment differs from the communication device 100C according to the nineteenth embodiment in that the driver 1D according to the sixth embodiment or the driver 1K according to the thirteenth embodiment is also applied to a transmitter 130D on the other end side of the differential transmission line 110.

A receiver 230 is connected in parallel with the transmitter 120C.

According to the twentieth embodiment, simultaneous two-way transmission of a common-mode signal can be performed by using the driver 1D according to the sixth embodiment or the driver 1K according to the thirteenth embodiment.

It should be understood by those skilled in the art that various modifications, combinations, sub-combinations and alterations may occur depending on design requirements and other factors insofar as they are within the scope of the appended claims or the equivalents thereof.

What is claimed is:

1. A differential drive circuit comprising at least one of:
    a first drive system including
        a first field effect transistor of a first conductivity type,
        a second field effect transistor of the first conductivity type,
        a first resistor and a second resistor,
        a first circuit that uses negative feedback to control a source voltage of the first field effect transistor so as to be equal to a first drive target voltage that is supplied, and
        a second circuit that uses negative feedback to control a source voltage of the second field effect transistor so as to be equal to a second drive target voltage that is supplied,
            the first field effect transistor having a source connected to a power supply potential source via the first resistor, and a drain connected to a first output node,
            the second field effect transistor having a source connected to the power supply potential source via the second resistor, and a drain connected to a second output node; and
    a second drive system including
        a third field effect transistor of a second conductivity type,
        a fourth field effect transistor of the second conductivity type,
        a third resistor and a fourth resistor,
        a third circuit that uses negative feedback to control a source voltage of the third field effect transistor so as to be equal to a third drive target voltage that is supplied, and
        a fourth circuit that uses negative feedback to control a source voltage of the fourth field effect transistor so as to be equal to a fourth drive target voltage that is supplied,
            the third field effect transistor having a source connected to a reference potential source via the third resistor, and a drain connected to the first output node,
            the fourth field effect transistor having a source connected to the reference potential source via the fourth resistor, and a drain connected to the second output node,
    wherein the differential drive circuit drives a common-mode voltage so as to form a constant differential signal across a load resistance.

2. The differential drive circuit according to claim 1, wherein:
    in the first drive system, the first drive target voltage and the second drive target voltage form a differential signal pair whose sum is constant; and
    in the second drive system, the third drive target voltage and the fourth drive target voltage form a differential signal pair whose sum is constant.

3. The differential drive circuit according to claim 2, wherein if the differential drive circuit has the first drive system and the second drive system,
    the first drive target voltage and the third drive target voltage are signals of the same waveform with an offset, and
    the second drive target voltage and the fourth drive target voltage are signals of the same waveform with an offset.

4. A differential drive circuit comprising at least one of:
a first drive system including
- a first field effect transistor of a first conductivity type,
- a second field effect transistor of the first conductivity type,
- a first resistor and a second resistor,
- a first circuit that controls a source voltage of the first field effect transistor so as to be equal to a first drive target voltage that is supplied, and
- a second circuit that controls a source voltage of the second field effect transistor so as to be equal to a second drive target voltage that is supplied,
  - the first field effect transistor having a source connected to a power supply potential source via the first resistor, and a drain connected to a first output node,
  - the second field effect transistor having a source connected to the power supply potential source via the second resistor, and a drain connected to a second output node; and a second drive system including
- a third field effect transistor of a second conductivity type,
- a fourth field effect transistor of the second conductivity type,
- a third resistor and a fourth resistor,
- a third circuit that controls a source voltage of the third field effect transistor so as to be equal to a third drive target voltage that is supplied, and
- a fourth circuit that controls a source voltage of the fourth field effect transistor so as to be equal to a fourth drive target voltage that is supplied,
  - the third field effect transistor having a source connected to a reference potential source via the third resistor, and a drain connected to the first output node,
  - the fourth field effect transistor having a source connected to the reference potential source via the fourth resistor, and a drain connected to the second output node, wherein the differential drive circuit drives a common-mode voltage so as to form a constant differential signal across a load resistance;
in the first drive system, the first drive target voltage and the second drive target voltage form a differential signal pair whose sum is constant;
in the second drive system, the third drive target voltage and the fourth drive target voltage form a differential signal pair whose sum is constant;
in the first drive system, an average voltage of the first drive target voltage and the second drive target voltage is biased so as to be lower than the power supply potential by a constant value; and
in the second drive system, an average voltage of the third drive target voltage and the fourth drive target voltage is biased so as to be higher than the reference potential by a constant value.

5. A differential drive circuit comprising at least one of:
a first drive system including
- a first field effect transistor of a first conductivity type,
- a second field effect transistor of the first conductivity type,
- a first resistor and a second resistor,
- a first circuit that controls a source voltage of the first field effect transistor so as to be equal to a first drive target voltage that is supplied, and
- a second circuit that controls a source voltage of the second field effect transistor so as to be equal to a second drive target voltage that is supplied,
  - the first field effect transistor having a source connected to a power supply potential source via the first resistor, and a drain connected to a first output node,
  - the second field effect transistor having a source connected to the power supply potential source via the second resistor, and a drain connected to a second output node; and a second drive system including
- a third field effect transistor of a second conductivity type,
- a fourth field effect transistor of the second conductivity type,
- a third resistor and a fourth resistor,
- a third circuit that controls a source voltage of the third field effect transistor so as to be equal to a third drive target voltage that is supplied, and
- a fourth circuit that controls a source voltage of the fourth field effect transistor so as to be equal to a fourth drive target voltage that is supplied,
  - the third field effect transistor having a source connected to a reference potential source via the third resistor, and a drain connected to the first output node,
  - the fourth field effect transistor having a source connected to the reference potential source via the fourth resistor, and a drain connected to the second output node, wherein the differential drive circuit drives a common-mode voltage so as to form a constant differential signal across a load resistance;
the first circuit includes a first operational amplifier, the first operational amplifier having a first input terminal connected to a supply line of the first drive target voltage, a second input terminal connected to the source of the first field effect transistor, and an output connected to a gate of the first field effect transistor;
the second circuit includes a second operational amplifier, the second operational amplifier having a third input terminal connected to a supply line of the second drive target voltage, a fourth input terminal connected to the source of the second field effect transistor, and an output connected to a gate of the second field effect transistor;
the third circuit includes a third operational amplifier, the third operational amplifier having a fifth input terminal connected to a supply line of the third drive target voltage, a sixth input terminal connected to the source of the third field effect transistor, and an output connected to a gate of the third field effect transistor; and
the fourth circuit includes a fourth operational amplifier, the fourth operational amplifier having a seventh input terminal connected to a supply line of the fourth drive target voltage, an eighth input terminal connected to the source of the fourth field effect transistor, and an output connected to a gate of the fourth field effect transistor.

6. A differential drive circuit comprising at least one of:
a first drive system including
- a first field effect transistor of a first conductivity type,
- a second field effect transistor of the first conductivity type,
- a first resistor and a second resistor,
- a first circuit that controls a source voltage of the first field effect transistor so as to be equal to a first drive target voltage that is supplied, and a second circuit that controls a source voltage of the second field effect transistor so as to be equal to a second drive target voltage that is supplied, the first field effect transistor having a source connected to a power supply potential source via the first resistor, and a drain connected to a first output node, the second field effect transistor having a source connected to the power supply potential source via the second resistor, and a drain connected to a second output node; and a second drive system including a third field effect transistor of a second conductivity type, a fourth field effect transistor of the second conductivity type, a third resistor and a fourth resistor, a third circuit that controls a source voltage of the third field effect transistor so as to be equal to a third drive target voltage that is supplied, and a fourth circuit that controls a source voltage of the fourth field effect transistor so as to be equal to a fourth drive target voltage that is supplied, the third field effect transistor having a source connected to a reference potential source via the third resistor, and a drain connected to the first output node, the fourth field effect transistor having a source connected to the reference potential source via the fourth resistor, and a drain connected to the second output node, wherein the differential drive circuit drives a common-mode voltage so as to form a constant differential signal across a load resistance;

the first drive system further includes a fifth resistor connected between the source of the first field effect transistor and the source of the second field effect transistor; and the second drive system further includes a sixth resistor connected between the source of the third field effect transistor and the source of the fourth field effect transistor.

7. The differential drive circuit according to claim 5, wherein:

the first drive system further includes a fifth resistor connected between the source of the first field effect transistor and the source of the second field effect transistor; and the second drive system further includes a sixth resistor connected between the source of the third field effect transistor and the source of the fourth field effect transistor.

8. A differential drive circuit comprising at least one of:

a first drive system including a first field effect transistor of a first conductivity type, a second field effect transistor of the first conductivity type, a first resistor and a second resistor, a first circuit that controls a source voltage of the first field effect transistor so as to be equal to a first drive target voltage that is supplied, and a second circuit that controls a source voltage of the second field effect transistor so as to be equal to a second drive target voltage that is supplied, the first field effect transistor having a source connected to a power supply potential source via the first resistor, and a drain connected to a first output node, the second field effect transistor having a source connected to the power supply potential source via the second resistor, and a drain connected to a second output node; and a second drive system including a third field effect transistor of a second conductivity type, a fourth field effect transistor of the second conductivity type, a third resistor and a fourth resistor, a third circuit that controls a source voltage of the third field effect transistor so as to be equal to a third drive target voltage that is supplied, and a fourth circuit that controls a source voltage of the fourth field effect transistor so as to be equal to a fourth drive target voltage that is supplied, the third field effect transistor having a source connected to a reference potential source via the third resistor, and a drain connected to the first output node, the fourth field effect transistor having a source connected to the reference potential source via the fourth resistor, and a drain connected to the second output node, wherein the differential drive circuit drives a common-mode voltage so as to form a constant differential signal across a load resistance;

the first drive system further includes a digital-to-analog converter (DAC) that generates the first drive target potential and the second drive target potential in accordance with inputted digital data; and the second drive system further includes a digital-to-analog converter (DAC) that generates the third drive target potential and the fourth drive target potential in accordance with inputted digital data.

9. The differential drive circuit according to claim 8, wherein:

the first drive system further includes a first DAC that generates the first drive target potential from a first addition/subtraction result of two numerical inputs, and a second DAC that generates the second drive target potential from a second addition/subtraction result of two numerical inputs; and the second drive system further includes a third DAC that generates the third drive target potential from a third addition/subtraction result of two numerical inputs, and a fourth DAC that generates the fourth drive target potential from a fourth addition/subtraction result of two numerical inputs.

10. The differential drive circuit according to claim 9, wherein:

the first drive system further includes a stabilizing circuit that stabilizes outputs of the first DAC and the second DAC; and the second drive system further includes a stabilizing circuit that stabilizes outputs of the third DAC and the fourth DAC.

11. The differential drive circuit according to claim 8, wherein:

the first drive system further includes a multiplier that multiplies a specific input by a coefficient specified so as to make an output of the DAC with respect to the input become a constant value, and inputs the multiplied input to the DAC; and the second drive system further includes a multiplier that multiplies a specific input by a coefficient specified so as to make an output of the DAC with respect to the input become a constant value, and inputs the multiplied input to the DAC.

12. A differential drive circuit comprising at least one of:
a first drive system including
   a first field effect transistor of a first conductivity type,
   a second field effect transistor of the first conductivity type,
   a first resistor and a second resistor,
   a first circuit that controls a source voltage of the first field effect transistor so as to be equal to a first drive target voltage that is supplied, and
   a second circuit that controls a source voltage of the second field effect transistor so as to be equal to a second drive target voltage that is supplied,
      the first field effect transistor having a source connected to a power supply potential source via the first resistor, and a drain connected to a first output node,
      the second field effect transistor having a source connected to the power supply potential source via the second resistor, and a drain connected to a second output node; and
a second drive system including
   a third field effect transistor of a second conductivity type,
   a fourth field effect transistor of the second conductivity type,
   a third resistor and a fourth resistor,
   a third circuit that controls a source voltage of the third field effect transistor so as to be equal to a third drive target voltage that is supplied, and
   a fourth circuit that controls a source voltage of the fourth field effect transistor so as to be equal to a fourth drive target voltage that is supplied,
      the third field effect transistor having a source connected to a reference potential source via the third resistor, and a drain connected to the first output node,
      the fourth field effect transistor having a source connected to the reference potential source via the fourth resistor, and a drain connected to the second output node,
wherein the differential drive circuit drives a common-mode voltage so as to form a constant differential signal across a load resistance;
the first drive system further includes a first differential amplifier that receives a differential voltage and generates the first drive target voltage and the second drive target voltage, supplies the generated first drive target voltage to the first circuit, and supplies the generated second drive target voltage to the second circuit;
the second drive system further includes a second differential amplifier that receives the differential voltage and generates the third drive target voltage and the fourth drive target voltage, supplies the generated third drive target voltage to the third circuit, and supplies the generated fourth drive target voltage to the fourth circuit.

13. The differential drive circuit according to claim 12, wherein:
   the first drive system further includes a fifth resistor connected between the source of the first field effect transistor and the source of the second field effect transistor; and
   the second drive system further includes a sixth resistor connected between the source of the third field effect transistor and the source of the fourth field effect transistor.

14. The differential drive circuit according to claim 12, wherein:
   the first drive system further includes an offset adding circuit that adds an offset to each of the first drive target potential and the second drive target potential that are generated by the first differential amplifier; and
   the second drive system further includes an offset adding circuit that adds an offset to each of the third drive target potential and the fourth drive target potential that are generated by the second differential amplifier.

15. The differential drive circuit according to claim 12, wherein:
   the first drive system further includes
      a first resistance-adjusting field effect transistor that is connected in parallel with a load resistance of the first differential amplifier, and
      an adjusting circuit that adjusts a gate potential of the first resistance-adjusting field effect transistor; and
   the second drive system further includes
      a second resistance-adjusting field effect transistor that is connected in parallel with a load resistance of the second differential amplifier, and
      an adjusting circuit that adjusts a gate potential of the second resistance-adjusting field effect transistor.

16. The differential drive circuit according to claim 5, wherein the differential drive circuit is connected with a common-mode feedback circuit that absorbs excess current supplied to a load side.

17. A communication device comprising:
   a transmitter arranged on either end side of a differential transmission line, wherein
   the transmitter includes a differential drive circuit that drives a common-mode voltage so as to form a constant differential signal across a load resistance; and
   the differential drive circuit includes
      a first field effect transistor of a first conductivity type
      a second field effect transistor of the first conductivity type,
      a third field effect transistor of a second conductivity type,
      a fourth field effect transistor of the second conductivity type,
      a first output node and a second output node,
      a first resistor, a second resistor, a third resistor, and a fourth resistor,
         the first field effect transistor having a source connected to a power supply potential via the first resistor, and a drain connected to the first output node,
         the second field effect transistor having a source connected to the power supply potential via the second resistor, and a drain connected to the second output node,
         the third field effect transistor having a source connected to a reference potential via the third resistor, and a drain connected to the first output node, the fourth field effect transistor having a source connected to the reference potential via the fourth resistor, and a drain connected to the second output node,
a first circuit that uses negative feedback to control a source voltage of the first field effect transistor so as to be equal to a first drive target voltage that is supplied,
a second circuit that uses negative feedback to control a source voltage of the second field effect transistor so as to be equal to a second drive target voltage that is supplied,
a third circuit that uses negative feedback to control a source voltage of the third field effect transistor so as to be equal to a third drive target voltage that is supplied, and
a fourth circuit that uses negative feedback to control a source voltage of the fourth field effect transistor so as to be equal to a fourth drive target voltage that is supplied.

18. A communication device comprising:
a transmitter arranged on either end side of a differential transmission line, wherein
the transmitter includes a differential drive circuit that drives a common-mode voltage so as to form a constant differential signal across a load resistance; and
the differential drive circuit includes
a first field effect transistor of a first conductivity type
a second field effect transistor of the first conductivity type,
a third field effect transistor of a second conductivity type,
a fourth field effect transistor of the second conductivity type,
a first output node and a second output node,
a first resistor, a second resistor, a third resistor, and a fourth resistor,
the first field effect transistor having a source connected to a power supply potential via the first resistor, and a drain connected to the first output node,
the second field effect transistor having a source connected to the power supply potential via the second resistor, and a drain connected to the second output node,
the third field effect transistor having a source connected to a reference potential via the third resistor, and a drain connected to the first output node,
the fourth field effect transistor having a source connected to the reference potential via the fourth resistor, and a drain connected to the second output node,
a first circuit that controls a source voltage of the first field effect transistor so as to be equal to a first drive target voltage that is supplied,
a second circuit that controls a source voltage of the second field effect transistor so as to be equal to a second drive target voltage that is supplied,
a third circuit that controls a source voltage of the third field effect transistor so as to be equal to a third drive target voltage that is supplied, and
a fourth circuit that controls a source voltage of the fourth field effect transistor so as to be equal to a fourth drive target voltage that is supplied;
a fifth resistor connected between the source of the first field effect transistor and the source of the second field effect transistor; and
a sixth resistor connected between the source of the third field effect transistor and the source of the fourth field effect transistor.

19. A communication device comprising:
a transmitter arranged on either end side of a differential transmission line, wherein
the transmitter includes a differential drive circuit that drives a common-mode voltage so as to form a constant differential signal across a load resistance; and
the differential drive circuit includes
a first field effect transistor of a first conductivity type
a second field effect transistor of the first conductivity type,
a third field effect transistor of a second conductivity type,
a fourth field effect transistor of the second conductivity type,
a first output node and a second output node,
a first resistor, a second resistor, a third resistor, and a fourth resistor,
the first field effect transistor having a source connected to a power supply potential via the first resistor, and a drain connected to the first output node,
the second field effect transistor having a source connected to the power supply potential via the second resistor, and a drain connected to the second output node,
the third field effect transistor having a source connected to a reference potential via the third resistor, and a drain connected to the first output node,
the fourth field effect transistor having a source connected to the reference potential via the fourth resistor, and a drain connected to the second output node,
a first circuit that controls a source voltage of the first field effect transistor so as to be equal to a first drive target voltage that is supplied,
a second circuit that controls a source voltage of the second field effect transistor so as to be equal to a second drive target voltage that is supplied,
a third circuit that controls a source voltage of the third field effect transistor so as to be equal to a third drive target voltage that is supplied, and
a fourth circuit that controls a source voltage of the fourth field effect transistor so as to be equal to a fourth drive target voltage that is supplied;
a first differential amplifier that receives a differential voltage and generates the first drive target voltage and the second drive target voltage, supplies the generated first drive target voltage to the first circuit, and supplies the generated second drive target voltage to the second circuit; and
a second differential amplifier that receives the differential voltage and generates the third drive target voltage and the fourth drive target voltage, supplies the generated third drive target voltage to the third circuit, and supplies the generated fourth drive target voltage to the fourth circuit.

20. A communication device comprising:
a transmitter arranged on either end side of a differential transmission line, wherein
the transmitter includes a differential drive circuit that drives a common-mode voltage so as to form a constant differential signal across a load resistance; and the differential drive circuit includes
- a first field effect transistor of a first conductivity type
- a second field effect transistor of the first conductivity type,
- a third field effect transistor of a second conductivity type,
- a fourth field effect transistor of the second conductivity type,
- a first output node and a second output node,
- a first resistor, a second resistor, a third resistor, and a fourth resistor,
  - the first field effect transistor having a source connected to a power supply potential via the first resistor, and a drain connected to the first output node,
  - the second field effect transistor having a source connected to the power supply potential via the second resistor, and a drain connected to the second output node,
  - the third field effect transistor having a source connected to a reference potential via the third resistor, and a drain connected to the first output node,
  - the fourth field effect transistor having a source connected to the reference potential via the fourth resistor, and a drain connected to the second output node,
- a first circuit that controls a source voltage of the first field effect transistor so as to be equal to a first drive target voltage that is supplied,
- a second circuit that controls a source voltage of the second field effect transistor so as to be equal to a second drive target voltage that is supplied,
- a third circuit that controls a source voltage of the third field effect transistor so as to be equal to a third drive target voltage that is supplied, and
- a fourth circuit that controls a source voltage of the fourth field effect transistor so as to be equal to a fourth drive target voltage that is supplied; and a receiver arranged in parallel with the transmitter with respect to the differential transmission line.

* * * * *